(12) United States Patent
Negoro et al.

(10) Patent No.: US 7,242,059 B2
(45) Date of Patent: Jul. 10, 2007

(54) SEMICONDUCTOR DEVICE HAVING DMOS AND CMOS ON SINGLE SUBSTRATE

(75) Inventors: Takaaki Negoro, Hyogo-ken (JP); Keiji Fujimoto, Hyogo-ken (JP); Takeshi Kimura, Kanagawa-ken (JP)

(73) Assignee: Ricoh Company, Ltd., Tokyo (JP)

( * ) Notice: Subject to any disclaimer, the term of this patent is extended or adjusted under 35 U.S.C. 154(b) by 157 days.

(21) Appl. No.: 10/769,817

(22) Filed: Feb. 3, 2004
(Under 37 CFR 1.47)

(65) Prior Publication Data

US 2004/0227183 A1 Nov. 18, 2004

(30) Foreign Application Priority Data

Feb. 6, 2003 (JP) ............................. 2003-029375

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ...................... 257/338; 257/341; 257/351; 257/357; 257/371

(58) Field of Classification Search ................ 257/338, 257/341, 350, 357, 371, 351
See application file for complete search history.

(56) References Cited

U.S. PATENT DOCUMENTS

| | | | | | |
|---|---|---|---|---|---|
| 4,878,096 | A | * | 10/1989 | Shirai et al. ................. 257/338 |
| 4,887,142 | A | * | 12/1989 | Bertotti et al. .............. 257/338 |
| 5,045,492 | A | * | 9/1991 | Huie et al. ................... 438/206 |
| 5,204,541 | A | * | 4/1993 | Smayling et al. ........... 257/138 |
| 5,296,393 | A | * | 3/1994 | Smayling et al. ........... 438/275 |
| 5,386,135 | A | * | 1/1995 | Nakazato et al. ........... 257/369 |
| 5,408,125 | A | * | 4/1995 | Erdeljac et al. ............. 257/607 |
| 5,541,125 | A | * | 7/1996 | Williams et al. ............ 438/202 |
| 5,556,796 | A | * | 9/1996 | Garnett et al. .............. 438/294 |
| 5,589,405 | A | * | 12/1996 | Contiero et al. ............ 438/268 |
| 5,610,421 | A | * | 3/1997 | Contiero et al. ............ 257/321 |
| 5,777,362 | A | * | 7/1998 | Pearce ........................ 257/335 |
| 5,905,284 | A | * | 5/1999 | Fujii et al. .................. 257/335 |
| 5,913,114 | A | * | 6/1999 | Lee et al. .................... 438/202 |

(Continued)

FOREIGN PATENT DOCUMENTS

JP 9-237841 9/1997

*Primary Examiner*—Ida M. Soward
(74) *Attorney, Agent, or Firm*—Dickstein Shapiro LLP

(57) ABSTRACT

A semiconductor device includes a P-type semiconductor substrate, a P-channel DMOS transistor, a CMOS transistor. The P-channel DMOS transistor is disposed on the P-type semiconductor substrate and includes a drain formed of the P-type semiconductor substrate and a source formed in the P-type semiconductor substrate on a main surface of the P-type semiconductor substrate. The CMOS transistor is disposed on the P-type semiconductor substrate and includes a P-channel MOS transistor and an N-channel MOS transistor. The P-channel MOS transistor is formed in an N-type region formed in the P-type semiconductor substrate on the main surface of the P-type semiconductor substrate. The N-channel MOS transistor is formed in a P-type region formed in the P-type semiconductor substrate on the main surface of the P-type semiconductor substrate. The P-type region is electrically isolated from the P-type semiconductor substrate by the N-type region.

22 Claims, 25 Drawing Sheets

U.S. PATENT DOCUMENTS

| | | | |
|---|---|---|---|
| 6,025,621 A * | 2/2000 | Lee et al. | 257/296 |
| 6,359,318 B1 * | 3/2002 | Yamamoto et al. | 257/378 |
| 6,380,004 B2 * | 4/2002 | Boden et al. | 438/138 |
| 6,392,275 B1 * | 5/2002 | Jang | 257/343 |
| 6,674,114 B2 * | 1/2004 | Taniguchi et al. | 257/303 |
| 6,696,707 B2 * | 2/2004 | Polce et al. | 257/168 |
| 6,844,578 B2 * | 1/2005 | Harada et al. | 257/278 |
| 6,897,525 B1 * | 5/2005 | Kikuchi et al. | 257/343 |
| 6,911,694 B2 * | 6/2005 | Negoro et al. | 257/336 |
| 2003/0162375 A1 * | 8/2003 | Chen et al. | 438/527 |
| 2004/0259318 A1 * | 12/2004 | Williams et al. | 438/400 |

* cited by examiner

SEMICONDUCTOR DEVICE HAVING DMOS AND CMOS ON SINGLE SUBSTRATE This patent specification is based on Japanese patent application, No. 2003-029375 filed on Feb. 6, 2003 in the Japanese Patent Office, which is hereby incorporated by reference in its entirety.

1. Field of the Invention

The present invention relates to a semiconductor device having a mixture of a DMOS transistor (double diffused metal oxide semiconductor field effect transistor) and a CMOS (complementary metal oxide semiconductor) including a P-channel MOS (metal oxide semiconductor) transistor and an N-channel MOS (metal oxide semiconductor) transistor. More particularly, the present invention relates to a semiconductor device applicable to a semiconductor device equipped with a fixed voltage circuit and a high withstand voltage semiconductor device.

2. Background of the Invention

FIG. 1 illustrates a cross-sectional view of a background semiconductor device including a mixture of a DMOS transistor and a CMOS transistor. In this example, the semiconductor device includes a P-channel DMOS transistor (hereinafter referred to as a PchDMOS transistor).

A P-channel MOS transistor (hereinafter referred to as a PchMOS), an N-channel MOS transistor (hereinafter referred to as a NchMOS), and LOCOS (local oxidation of silicon) oxide layers 6 are formed on a surface of a P-channel semiconductor substrate 72 having a resistivity value of approximately 20 Ωcm. The PchMOS and the NchMOS form a CMOS transistor. The LOCOS oxide layers 6 serve to isolate the PchDMOS transistor formation region. The P-channel semiconductor substrate 72 has an Nwell region 74, a Pwell region 76, and an Nwell region 78 on a main surface thereof. The Nwell region 74 corresponds to the PchDMOS transistor formation region. The Pwell region 76 corresponds to an NchMOS transistor formation region. The Nwell region 78 corresponds to the PchDMOS transistor formation region.

One exemplary PchDMOS transistor will be now described.

The Nwell region 78 includes a Pwell region 80 and an N-type high concentration diffusion layer (N+) 82. The Pwell region 80 forms a drain of the PchDMOS transistor. The N-type high concentration diffusion layer 82 serves to assume a potential of the Nwell region 78. The Pwell region 80 includes an N-channel diffusion layer (N−) 84. The Pwell region 80 also includes P-type high concentration diffusion layers (P+) 86 for drain contacts on both sides of the N-channel diffusion layer 84. The P-type high concentration diffusion layers 86 are arranged on the N-channel diffusion layer 84 spaced from each other.

The N-channel diffusion layer 84 includes two P-type high concentration diffusion layers (P+) 88 spaced from each other. The two P-type high concentration diffusion layers 88 are spaced from both side of the P-type high concentration diffusion layers 86. The N-channel diffusion layer 84 includes an N-type high concentration diffusion layer (N+) 90 between the P-type high concentration diffusion layers 88. The N-type high concentration diffusion layer 90 serves to assume a potential of the N-channel diffusion layer 84. The P-type high concentration diffusion layers 88 form a source of the PchDMOS transistor.

Polysilicon-made gate electrodes 94 are formed on the N-channel diffusion layer 84 and the Pwell region 80 adjacent to the P-type high concentration diffusion layers 88 through gate oxide layers 92. The gate electrodes 94 are spaced apart from the P-type high concentration diffusion layers 86. Surfaces of the N-channel diffusion layer 84 disposed below the gate electrodes 94 are channel regions.

One exemplary PchMOS transistor will be now described.

The Nwell region 74 includes two P-type high concentration diffusion layers (P+) 96 which form a source and a drain. The two P-type high concentration diffusion layers 96 are spaced from each other. On the Nwell region 74 between the P-type high concentration diffusion layers 96, a polysilicon-made gate electrode 100 is formed through a gate oxide layer 98.

One exemplary NchMOS transistor will be now described.

The Pwell region 76 includes two N-type high concentration diffusion layers (N+) 102 which form a source and a drain. The two N-type high concentration diffusion layers 102 are spaced from each other. On the Pwell region 76 between the N-type high concentration diffusion layers 102, a polysilicon-made gate electrode 106 is formed through a gate oxide layer 104.

One exemplary semiconductor device including a mixture of a DMOS transistor and a CMOS transistor is described in Japanese Laid-Open Patent Application Publication No. 9-237841. Such a semiconductor device generally applies to a semiconductor device equipped with a fixed voltage circuit. In the fixed voltage circuit, the DMOS transistor serves as an output transistor. The fixed voltage circuit can output a constant voltage under high output current.

FIG. 2 is a cross-sectional view illustrating a connection when a background semiconductor device including the PchDMOS transistor and the CMOS transistor is applied to a fixed voltage circuit. The semiconductor device shown in FIG. 2 has a similar structure as shown in FIG. 1.

As shown in FIG. 2, an input terminal 60 is connected to a P-type high concentration diffusion layers 88, an N-type high concentration diffusion layer 90, and an N-type high concentration diffusion layer 82. A P-type high concentration diffusion layers 88 include sources of the PchDMOS transistor. An N-type high concentration diffusion layer 90 serves to assume a potential of the N-channel diffusion layer 84. The N-type high concentration diffusion layer 82 serves to assume a potential of the Nwell region 78. The output terminal 62 is connected to the P-type high concentration diffusion layers 86 for assuming a potential of the Pwell region including a drain. The P-channel semiconductor substrate 72 is connected to a ground potential (GND).

The CMOS transistor as shown in FIG. 2 is generally applied to a CMOS transistor for use in a reference voltage generator and an operational amplifier including the controller.

As shown in FIG. 2, the PchDMOS transistor including the output transistor is a surface device. This structure disposes both of the input terminal 60 and the output terminal 62 on the main surface side, making routing of wires more complex and providing insufficient current-carrying capacity of the wires under high current.

In many cases, a background semiconductor device including a fixed voltage circuit employs a bipolar transistor as an output transistor. Particularly, in a fixed voltage circuit under high output current, a bipolar transistor has commonly been used due to a simple manufacturing process. However, the fixed voltage circuit which employs the bipolar transistor as the output transistor is driven by a current, thereby increasing in current. In addition, the fixed voltage circuit is constantly in its ON state at the time of voltage conversion, resulting in increased heat.

The fixed voltage circuit as shown in FIG. 1 is configured to output a current by using a surface channel PchDMOS transistor as the output transistor. However, thus-structured circuit has many disadvantages. One is that a connecting wire has insufficient current-carrying capacity under high current. In order to solve the problem, the circuit involves making source and drain wires wider. Another disadvantage is that the resulting source and drain wires decrease capabilities of the DMOS output transistor.

SUMMARY OF THE INVENTION

In one embodiment, a novel semiconductor device includes a P-type semiconductor substrate, a P-channel DMOS transistor, a CMOS transistor. The P-channel DMOS transistor is disposed on the P-type semiconductor substrate and includes a drain formed of the P-type semiconductor substrate and a source formed in the P-type semiconductor substrate on a main surface of the P-type semiconductor substrate. The CMOS transistor is disposed on the P-type semiconductor substrate and includes a P-channel MOS transistor and an N-channel MOS transistor. The P-channel MOS transistor is formed in an N-type region formed in the P-type semiconductor substrate on the main surface of the P-type semiconductor substrate. The N-channel MOS transistor is formed in a P-type region formed in the P-type semiconductor substrate on the main surface of the P-type semiconductor substrate. The P-type region is electrically isolated from the P-type semiconductor substrate by the N-type region.

The P-type semiconductor substrate may include a P-type high concentration semiconductor substrate and a first P-type low concentration epitaxial layer. The P-type high concentration semiconductor substrate may be disposed at a bottom of the P-type semiconductor substrate opposite to the main surface of the P-type semiconductor substrate. The first P-type low concentration epitaxial layer may be disposed on the P-type high concentration semiconductor substrate.

The N-type region may include a bottom portion including an N-type buried layer which is disposed at an interface of the P-type high concentration semiconductor substrate and the first P-type low concentration epitaxial layer.

The N-type region may further include at least two side portions, each including an Nwell region, to form a structure such that the P-type region is surrounded by the Nwell regions and the N-type buried layer.

The first P-type low concentration epitaxial layer may include a P-type buried layer disposed under a region where the source of the P-channel DMOS transistor is formed.

Further, in one embodiment, a novel semiconductor device includes a P-type semiconductor substrate, a P-channel DMOS transistor, and a CMOS transistor. The P-type semiconductor substrate includes a P-type high concentration semiconductor substrate, a first P-type low concentration epitaxial layer, and a second P-type low concentration epitaxial layer. The P-type high concentration semiconductor substrate is disposed at a bottom of the P-type semiconductor substrate opposite to a main surface of the P-type semiconductor substrate. The second P-type low concentration epitaxial layer is disposed on the P-type high concentration semiconductor substrate. The first P-type low concentration epitaxial layer is disposed on the second P-type low concentration epitaxial layer. The P-channel DMOS transistor is disposed on the P-type semiconductor substrate and includes a drain formed of the P-type semiconductor substrate and a source formed in the P-type semiconductor substrate on the main surface of the P-type semiconductor substrate. The CMOS transistor is disposed on the P-type semiconductor substrate and includes a P-channel MOS transistor and an N-channel MOS transistor. The P-channel MOS transistor is formed in an N-type region formed in the P-type semiconductor substrate on the main surface of the P-type semiconductor substrate. The N-channel MOS transistor is formed in a P-type region formed in the P-type semiconductor substrate on the main surface of the P-type semiconductor substrate. The P-type region is electrically isolated from the P-type semiconductor substrate by the N-type region. The N-type region may include a bottom portion including an N-type buried layer which is disposed at an interface of the first P-type low concentration epitaxial layer and the second P-type low concentration epitaxial layer.

Further, in one embodiment, a novel semiconductor device includes a P-type semiconductor substrate including a P-type high concentration semiconductor substrate, a first P-type low concentration epitaxial layer, a second P-type low concentration epitaxial layer, and a third P-type low concentration epitaxial layer. The P-type high concentration semiconductor substrate is disposed at a bottom of the P-type semiconductor substrate opposite to a main surface of the P-type semiconductor substrate. The second P-type low concentration epitaxial layer is disposed on the P-type high concentration semiconductor substrate. The third P-type low concentration epitaxial layer is disposed on the second P-type low concentration epitaxial layer. The first P-type low concentration epitaxial layer is disposed on the third P-type low concentration epitaxial layer. The P-channel DMOS transistor is disposed on the P-type semiconductor substrate and includes a drain formed of the P-type semiconductor substrate and a source formed in the P-type semiconductor substrate on the main surface of the P-type semiconductor substrate. The CMOS transistor is disposed on the P-type semiconductor substrate and includes a P-channel MOS transistor and an N-channel MOS transistor. The P-channel MOS transistor is formed in an N-type region formed in the P-type semiconductor substrate on a main surface of the P-type semiconductor substrate. The N-channel MOS transistor is formed in a P-type region formed in the P-type semiconductor substrate on the main surface of the P-type semiconductor substrate. The P-type region is electrically isolated from the P-type semiconductor substrate by the N-type region. The N-type region may include a bottom portion including an N-type buried layer which is disposed at an interface of the second P-type low concentration epitaxial layer and the third P-type low concentration epitaxial layer. The P-type region may include a bottom portion including a P-type buried layer which is disposed at an interface of the first P-type low concentration epitaxial layer and the third P-type low concentration epitaxial layer.

Further, in one embodiment, a novel semiconductor device includes an N-type semiconductor substrate, an N-channel DMOS transistor, and a CMOS transistor. The N-channel DMOS transistor is disposed on the N-type semiconductor substrate and includes a drain formed of the N-type semiconductor substrate and a source formed in the N-type semiconductor substrate on a main surface of the N-type semiconductor substrate. The CMOS transistor is disposed on the N-type semiconductor substrate and includes an N-channel MOS transistor and a P-channel MOS transistor. The N-channel MOS transistor is formed in a P-type region formed in the N-type semiconductor substrate on the main surface of the N-type semiconductor substrate. The P-channel MOS transistor is formed in an N-type region formed in the N-type semiconductor substrate on the main surface of the N-type semiconductor substrate. The N-type region is electrically isolated from the N-type semiconductor substrate by the P-type region.

The N-type semiconductor substrate may include an N-type high concentration semiconductor substrate and a first N-type low concentration epitaxial layer. The N-type high concentration semiconductor substrate may be disposed at a bottom of the N-type semiconductor substrate opposite to the main surface of the N-type semiconductor substrate. The first N-type low concentration epitaxial layer may be disposed on the N-type high concentration semiconductor substrate.

The P-type region may include a bottom portion including a P-type buried layer which is disposed at an interface of the N-type high concentration semiconductor substrate and the first N-type low concentration epitaxial layer.

The P-type region may further include at least two side portions, each including an Pwell region, to form a structure such that the N-type region is surrounded by the Pwell regions and the P-type buried layer.

The first N-type low concentration epitaxial layer may include an N-type buried layer disposed under a region where the source of the N-channel DMOS transistor is formed.

Further, in one embodiment, a novel semiconductor device includes an N-type semiconductor substrate, an N-channel DMOS transistor, and a CMOS transistor. The N-type semiconductor substrate includes an N-type high concentration semiconductor substrate, a first N-type low concentration epitaxial layer, and a second N-type low concentration epitaxial layer. The N-type high concentration semiconductor substrate is disposed at a bottom of the N-type semiconductor substrate opposite to a main surface of the N-type semiconductor substrate. The second N-type low concentration epitaxial layer is disposed on the N-type high concentration semiconductor substrate. The first N-type low concentration epitaxial layer is disposed on the second N-type low concentration epitaxial layer. The N-channel DMOS transistor is disposed on the N-type semiconductor substrate and includes a drain formed of the N-type semiconductor substrate and a source formed in the N-type semiconductor substrate on the main surface of the N-type semiconductor substrate. The CMOS transistor is disposed on the N-type semiconductor substrate and includes an N-channel MOS transistor and a P-channel MOS transistor. The N-channel MOS transistor is formed in a P-type region formed in the N-type semiconductor substrate on the main surface of the N-type semiconductor substrate. The P-channel MOS transistor is formed in an N-type region formed in the N-type semiconductor substrate on the main surface of the N-type semiconductor substrate. The N-type region is electrically isolated from the N type semiconductor substrate by the P-type region. The P-type region may include a bottom portion including a P-type buried layer which is disposed at an interface of the first N-type low concentration epitaxial layer and the second N-type low concentration epitaxial layer.

Further, in one embodiment, a novel semiconductor device includes an N-type semiconductor substrate including an N-type high concentration semiconductor substrate, a first N-type low concentration epitaxial layer, a second N-type low concentration epitaxial layer, and a third N-type low concentration epitaxial layer. The N-type high concentration semiconductor substrate is disposed at a bottom of the N-type semiconductor substrate opposite to a main surface of the N-type semiconductor substrate. The second N-type low concentration epitaxial layer is disposed on the N-type high concentration semiconductor substrate. The third N-type low concentration epitaxial layer is disposed on the second N-type low concentration epitaxial layer. The first N-type low concentration epitaxial layer is disposed on the third N-type low concentration epitaxial layer. The N-channel DMOS transistor is disposed on the N-type semiconductor substrate and includes a drain formed of the N-type semiconductor substrate and a source formed in the N-type semiconductor substrate on the main surface of the N-type semiconductor substrate. The CMOS transistor is disposed on the N-type semiconductor substrate and includes an N-channel MOS transistor and a P-channel MOS transistor. The N-channel MOS transistor is formed in a P-type region formed in the N-type semiconductor substrate on a main surface of the N-type semiconductor substrate. The P-channel MOS transistor is formed in an N-type region formed in the N-type semiconductor substrate on the main surface of the N-type semiconductor substrate. The N-type region is electrically isolated from the N-type semiconductor substrate by the P-type region. The P-type region may include a bottom portion including a P-type buried layer which is disposed at an interface of the second N-type low concentration epitaxial layer and the third N-type low concentration epitaxial layer. The N-type buried layer may be disposed on a bottom of the N-type region disposed at an interface of the first N-type low concentration epitaxial layer and the third N-type low concentration epitaxial layer.

Further, in one embodiment, a novel semiconductor device includes a fixed voltage circuit including a P-type semiconductor substrate, an output transistor, and a controller. The output transistor includes a P-channel DMOS transistor disposed on the P-type semiconductor substrate and including a drain formed of the P-type semiconductor substrate and a source formed in the P-type semiconductor substrate on a main surface of the P-type semiconductor substrate. The controller includes a CMOS transistor disposed on the P-type semiconductor substrate and including a P-channel MOS transistor and an N-channel MOS transistor. The P-channel MOS transistor is formed in an N-type region formed in the P-type semiconductor substrate on the main surface of the P-type semiconductor substrate. The N-channel MOS transistor is formed in a P-type region formed in the P-type semiconductor substrate on the main surface of the P-type semiconductor substrate. The P-type region is electrically isolated from the P-type semiconductor substrate by the N-type region. The controller may be configured to compare an output voltage from the output transistor with a reference voltage and provide feedback such that the output voltage remains constant.

The P-type semiconductor substrate may include a P-type high concentration semiconductor substrate and a first P-type low concentration epitaxial layer. The P-type high concentration semiconductor substrate may be disposed at a bottom of the P-type semiconductor substrate opposite to the main surface of the P-type semiconductor substrate and the first P-type low concentration epitaxial layer may be disposed on the P-type high concentration semiconductor substrate.

The N-type region may include a bottom portion including an N-type buried layer which is disposed at an interface of the P-type high concentration semiconductor substrate and the first P-type low concentration epitaxial layer.

The N-type region may further include at least two side portions, each including an Nwell region, to form a structure such that the P-type region is surrounded by the Nwell regions and the N-type buried layer.

The first P-type low concentration epitaxial layer may include a P-type buried layer disposed under a region where the source of the P-channel DMOS transistor is formed.

Further, in one embodiment, a novel semiconductor device includes a fixed voltage circuit including a P-type semiconductor substrate, an output transistor, and a controller. The P-type semiconductor substrate includes a P-type high concentration semiconductor substrate, a first P-type low concentration epitaxial layer, and a second P-type low concentration epitaxial layer. The P-type high concentration semiconductor substrate is disposed at a bottom of the P-type semiconductor substrate opposite to a main surface of the P-type semiconductor substrate. The second P-type low concentration epitaxial layer is disposed on the P-type high concentration semiconductor substrate. The first P-type low concentration epitaxial layer is disposed on the second P-type low concentration epitaxial layer. The output transistor includes a P-channel DMOS transistor disposed on the P-type semiconductor substrate and includes a drain formed of the P-type semiconductor substrate and a source formed in the P-type semiconductor substrate on the main surface of the P-type semiconductor substrate. The controller includes a CMOS transistor disposed on the P-type semiconductor substrate and including a P-channel MOS transistor and an N-channel MOS transistor. The P-channel MOS transistor is formed in an N-type region formed in the P-type semiconductor substrate on the main surface of the P-type semiconductor substrate. The N-channel MOS transistor is formed in a P-type region formed in the P-type semiconductor substrate on the main surface of the P-type semiconductor substrate. The P-type region is electrically isolated from the P-type semiconductor substrate by the N-type region. The N-type region may include a bottom portion including an N-type buried layer which is disposed at an interface of the first P-type low concentration epitaxial layer and the second P-type low concentration epitaxial layer.

Further, in one embodiment, a novel semiconductor device includes a fixed voltage circuit including a P-type semiconductor substrate, an output transistor, and a controller. The P-type semiconductor substrate includes a P-type semiconductor substrate including a P-type high concentration semiconductor substrate, a first P-type low concentration epitaxial layer, a second P-type low concentration epitaxial layer, and a third P-type low concentration epitaxial layer. The P-type high concentration semiconductor substrate is disposed at a bottom of the P-type semiconductor substrate opposite to a main surface of the P-type semiconductor substrate. The second P-type low concentration epitaxial layer is disposed on the P-type high concentration semiconductor substrate. The third P-type low concentration epitaxial layer is disposed on the second P-type low concentration epitaxial layer. The first P-type low concentration epitaxial layer is disposed on the third P-type low concentration epitaxial layer. The output transistor includes a P-channel DMOS transistor disposed on the P-type semiconductor substrate and including a drain formed of the P-type semiconductor substrate and a source formed in the P-type semiconductor substrate on the main surface of the P-type semiconductor substrate. The controller includes a CMOS transistor disposed on the P-type semiconductor substrate and including a P-channel MOS transistor and an N-channel MOS transistor. The P-channel MOS transistor is formed in an N-type region formed in the P-type semiconductor substrate on a main surface of the P-type semiconductor substrate. The N-channel MOS transistor is formed in a P-type region formed in the P-type semiconductor substrate on the main surface of the P-type semiconductor substrate. The P-type region is electrically isolated from the P-type semiconductor substrate by the N-type region. The N-type region may include a bottom portion including an N-type buried layer which is disposed at an interface of the second P-type low concentration epitaxial layer and the third P-type low concentration epitaxial layer. The P-type buried layer may be disposed on a bottom of the P-type region disposed at an interface of the first P-type low concentration epitaxial layer and the third P-type low concentration epitaxial layer.

Further, in one embodiment, a novel semiconductor device method includes the steps of forming, implanting, implanting, forming, forming, forming, forming, performing, depositing, patterning, masking, performing, masking, masking, and performing. The forming step forms a first P-type low concentration epitaxial layer on a P-type high concentration semiconductor substrate. The implanting step implant an N-type impurity into a CMOS formation region of the first P-type low concentration epitaxial layer to form an N-well region. The implanting step implants a P-type impurity into an NchMOS transistor formation region of the first P-type low concentration epitaxial layer to form a Pwell region. The forming step forms LOCOS oxide layers on the first P-type low concentration epitaxial layer. The forming step forms a first gate oxide layer on the Nwell region. The forming step forms a second gate oxide layer on the Pwell region. The forming step forms a third gate oxide layer on the first P-type low concentration epitaxial layer. The performing step performs channel doping implant into the Nwell region and the Pwell region. The depositing step deposits a polysilicon layer over the semiconductor substrate, which in turn has disposed thereon an oxide layer to form an N-type polysilicon layer. The patterning step patterns the polysilicon layer to form a first gate electrode, a second gate electrode in the NchMOS transistor formation region, and a third gate electrode. The masking step masks the third gate electrode to selectively implant an N-type impurity into the first P-type low concentration epitaxial layer of the PchDMOS transistor formation region. The performing step performs thermal processing to form a first N-channel diffusion layer. The masking step masks the first and third gate electrodes to selectively implant a P-type impurity into source formation regions in the first Nwell region of the PchMOS transistor formation region, the first N-channel diffusion layer of the PchDMOS transistor formation region, and the first and third gate electrodes. The masking step masks the second gate to selectively implant an N-type impurity into the first Pwell region of the NchMOS transistor formation region and the N-type high concentration diffusion layer formation region of the first N-channel diffusion layer in the PchDMOS transistor formation region. The performing step performs thermal processing to form the first P-type high concentration diffusion layers, N-type high concentration diffusion layers on the Pwell region, and the first N-type high concentration diffusion layer and the second P-type high concentration diffusion layers on the first N-channel diffusion layer.

Further, in one embodiment, a novel semiconductor device includes a first-polarity-type semiconductor substrate, a first-polarity-channel DMOS transistor, and a CMOS transistor.

The first-polarity-channel DMOS transistor is disposed on the first-polarity-type semiconductor substrate and includes a drain formed of the first-polarity-type semiconductor substrate and a source formed in the first-polarity-type semiconductor substrate on a main surface of the first-polarity-type semiconductor substrate. The CMOS transistor is disposed on the first-polarity-type semiconductor substrate and includes a first-polarity-channel MOS transistor and a second-polarity-channel MOS transistor. The first-polarity-channel MOS transistor is formed in a second-polarity-type region formed in the first-polarity-type semiconductor substrate on the main surface of the first-polarity-type semiconductor substrate. The second-polarity-channel MOS transistor is formed in a first-polarity-type region formed in the first-polarity-type semiconductor substrate on the main surface of the first-polarity-type semiconductor substrate. The first-polarity-type region is electrically isolated from the first-polarity-type semiconductor substrate by the second-polarity-type region.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
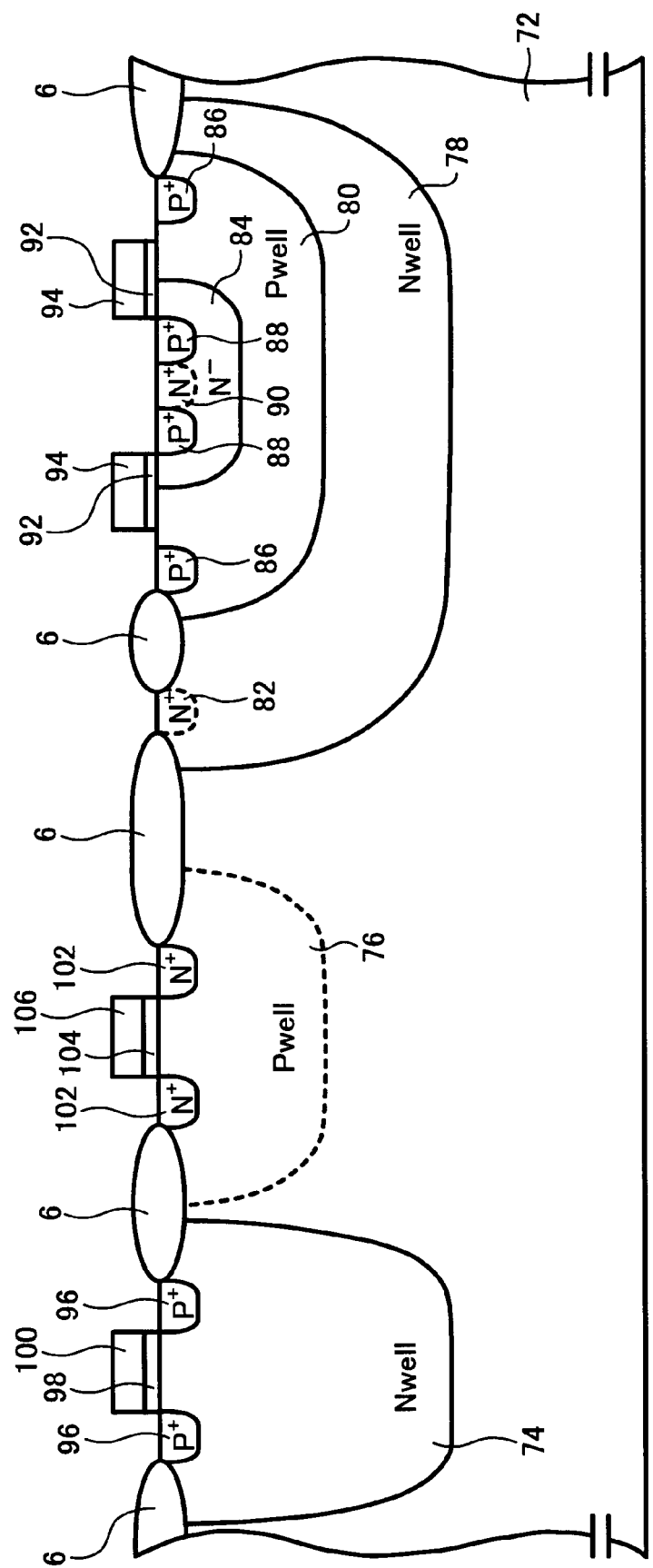
FIG. 1 is a cross-sectional view illustrating a background semiconductor device including a PchDMOS transistor and a CMOS transistor.
Figure 2:
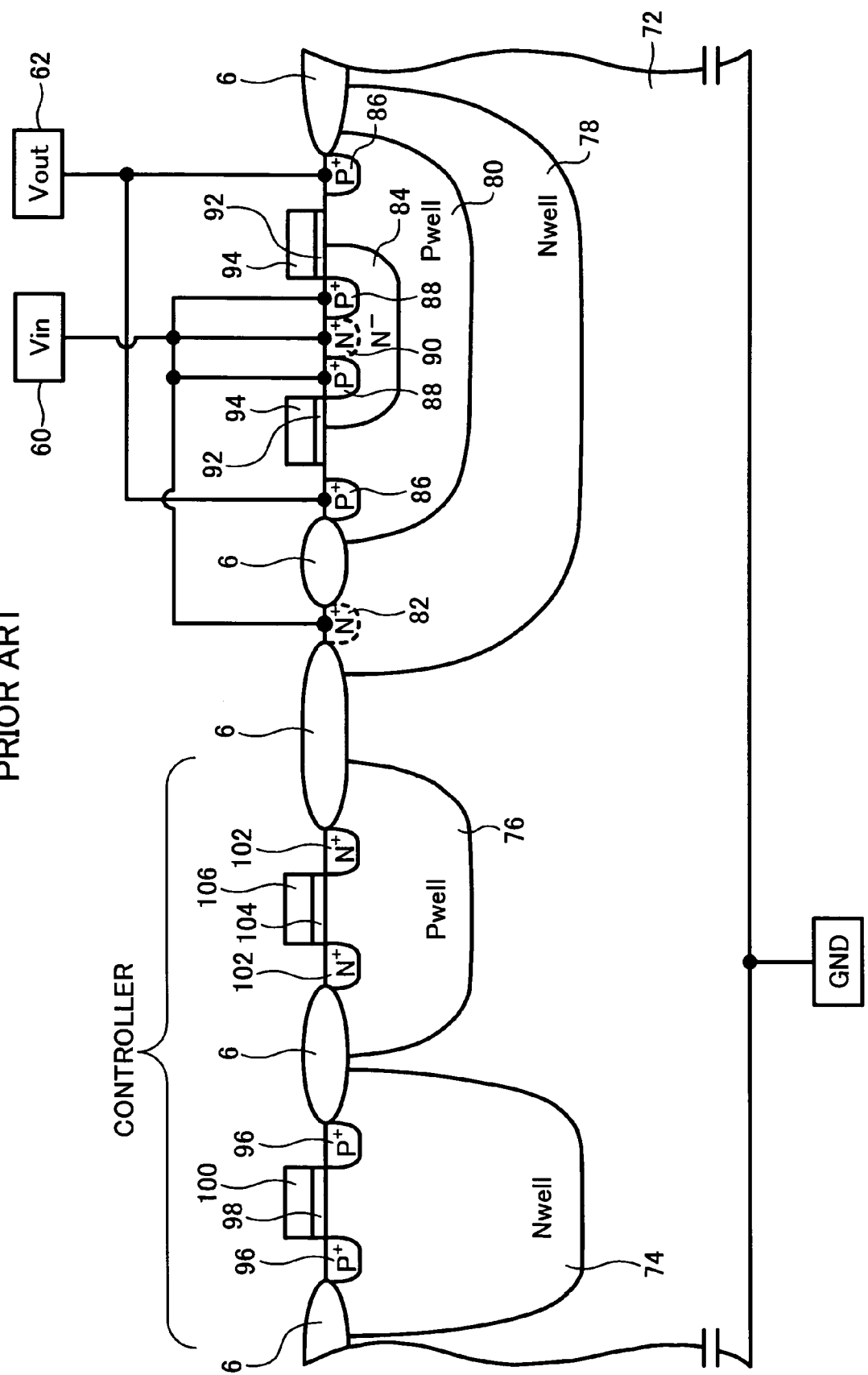
FIG. 2 is a cross-sectional view illustrating a connection when a background semiconductor device including a PchDMOS transistor and a CMOS transistor is applied to a fixed voltage circuit.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner. Referring now to the drawings, wherein like reference numerals designate identical or corresponding parts throughout the several views, particularly to FIG. 1, a semiconductor device according to a preferred embodiment of the present invention is explained.

Figure 3:
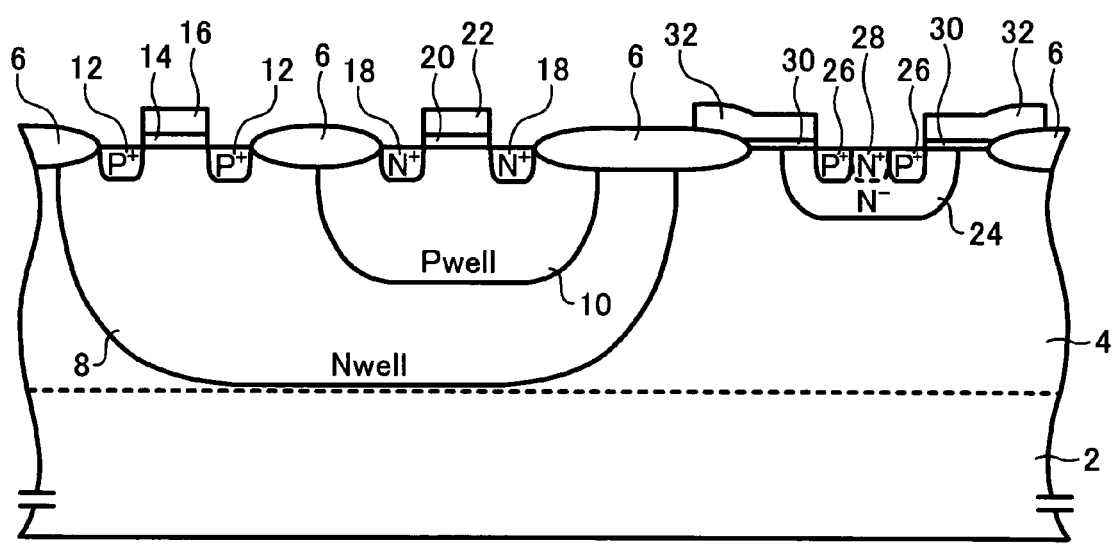
FIG. 3 is a cross-sectional view of a semiconductor device according to an embodiment of the present invention.

FIG. 3 is a cross-sectional view illustrating an embodiment according to the present invention.

A P-type high concentration semiconductor substrate 2 has a P-type low concentration epitaxial layer 4 (i.e., a first P-type low concentration epitaxial layer) formed thereon. The P-type high concentration semiconductor substrate 2 has a resistivity value less than 0.1 Ωcm. The P-type low concentration epitaxial layer 4 has a resistivity value of approximately 20 Ωcm. The P-type high concentration semiconductor substrate 2 and the P-type low concentration epitaxial layer 4 form a substrate of the semiconductor device according to the present invention.

The P-type low concentration epitaxial layer 4 has LOCOS oxide layers 6 formed on an upper surface (hereinafter referred to as a main surface). The LOCOS oxide layers 6 are formed by LOCOS (local oxidation of silicon) method to isolate a transistor formation region for device isolation.

The P-type low concentration epitaxial layer 4 including a COMOS formation region has an Nwell region 8 formed thereon. The COMOS formation region includes a PchMOS transistor and a NchMOS transistor. The Nwell region 8 includes an N-type region of a semiconductor device according to the present invention.

In the Nwell region 8, a Pwell region 10 is formed on a region including the NchMOS transistor formation region. The Pwell region 10 includes a P-type region of the semiconductor device according to the present invention.

The Nwell region 8 in regions other than the Pwell region 10 includes a PchMOS transistor formed therein. The PchMOS transistor includes two P-type high concentration diffusion layers (P+) 12 and a polysilicon-made gate electrode 16. The P-type high concentration diffusion layers 12 are spaced from each other in the Nwell region 8. The gate electrode 16 is formed on the Nwell region 8 between the P-type high concentration diffusion layers 12 through a gate oxide layer 14 (i.e., a first gate oxide layer). The P-type high concentration diffusion layers 12 serve as a source and a drain of the PchMOS transistor.

The Pwell region 10 includes the NchMOS transistor formed therein. The NchMOS transistor includes two N-type high concentration diffusion layers (N+) 18 and a polysilicon-layered gate electrode 22. The N-type high concentration diffusion layers 18 are spaced from each other in the Pwell region 10. The gate electrode 22 is formed on the Pwell region 10 between the N-type high concentration diffusion layers 18 through a gate oxide layer 20 (i.e., a second gate oxide layer). The N-type high concentration diffusion layers 18 include a source and a drain of the NchMOS transistor.

The P-type low concentration epitaxial layer 4 in regions other than the CMOS formation region has an N-channel diffusion layer (N−) 24 for a PchDMOS transistor formed on its main surface. The N-channel diffusion region 24 are spaced from LOCOS oxide layers 6.

In the N-channel diffusion layer 24, two P-type high concentration diffusion layers 26 are spaced from each other. The N-channel diffusion layer 24 also includes an N-type high concentration diffusion layer (N+) 28 between the P-type high concentration diffusion layers 26 formed therein. The N-type high concentration diffusion layer 28 serves to assume a potential of the N-channel diffusion layer 24.

A gate oxide layer 30 (i.e., a third gate oxide layer) is formed on the N-channel diffusion layer 24 and the P-type low concentration epitaxial layer 4. That is, the gate oxide layer 30 is formed from the opposite end of the N-type high concentration diffusion layer 28 via the P-type high concentration diffusion layers 26 to one end of the LOCOS oxide layers 6. Disposed over the gate oxide layer 30 and the LOCOS oxide layers 6 is a polysilicon-layered gate electrode 32 (i.e., a third gate electrode).

The P-type high concentration diffusion layers 26 serve as sources of the PchDMOS transistor. The P-type low concentration epitaxial layer 4 and the P-type high concentration semiconductor substrate 2 serve as drains of the PchDMOS transistor.

In this embodiment, since the PchDMOS transistor includes a vertical DMOS transistor, an output wiring of the PchDMOS transistor is disposed only on the P-type high concentration diffusion layers 26 serving as a source. The output wiring of the PchDMOS transistor is formed on the main surface of the P-type low concentration epitaxial layer 4. Therefore, this system has many advantages. One advantage is that the number of the output wirings of the PchDMOS transistor is decreased in half as compared to source and drain wirings of a background surface device. This increases in current-carrying capacity, causing the PchDMOS transistor to improve a current-carrying capacity.

Another advantage is that the CMOS, formed on the P-type low concentration epitaxial layer 4, is formed in the Nwell region 8 and the Pwell region 10. The Nwell region 8 and the Pwell region 10 are isolated from the P-type low concentration epitaxial layer 4 and the P-type high concentration semiconductor substrate 2 so that the CMOS is commercially available.

Another advantage is that a multi-layered structure of the P-type high concentration semiconductor substrate 2 and the P-type low concentration epitaxial layer 4 are formed on the semiconductor substrate sequentially from a back surface opposite to the main surface of the semiconductor substrate. This structure reduces a drain resistance of the PchDMOS transistor to improve product performance. Further, regions other than the drain of the PchDMOS transistor (i.e., the N-channel diffusion layer 24, the P-type high concentration diffusion layers 26 serving as a source, the N-type high concentration diffusion layer 28, and the Nwell region 8 and the Pwell region 10 forming the CMOS) are formed in the P-type low concentration epitaxial layer 4. This structure simplifies a manufacture of the CMOS and DMOS transistors.

FIGS. 4A–4H are cross-sectional views explaining an exemplary manufacturing processes of the embodiment shown in FIG. 3. Referring now to FIGS. 3 to 4A–4H, an exemplary manufacturing method will be described.

Figure 4A:
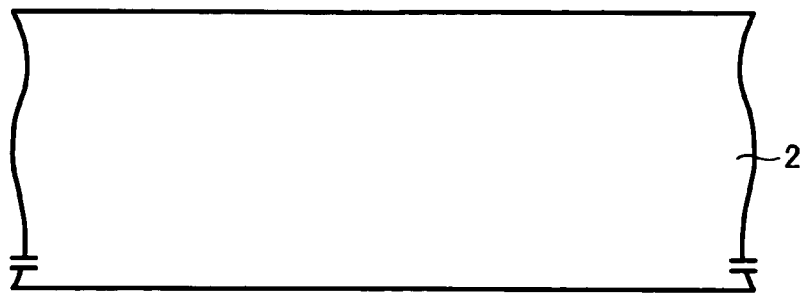
FIGS. 4A–4D are cross-sectional views illustrating an example of a first half of manufacturing processes of the embodiment shown in FIG. 3.

In Step 1, the P-type high concentration semiconductor substrate 2 having resistivity of less than approximately 0.1 Ωcm is prepared (see FIG. 4A).

Figure 4B:
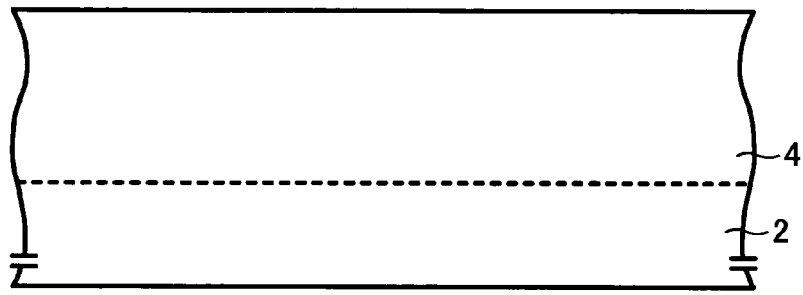
Figure 4C:
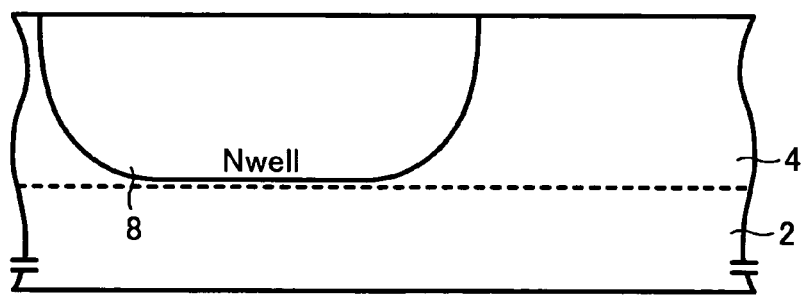
Figure 4D:
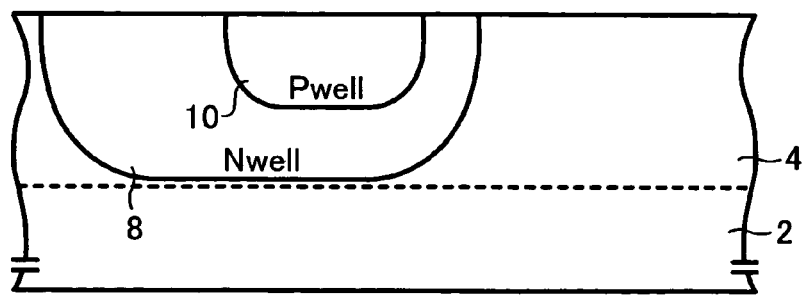
Figure 4E:
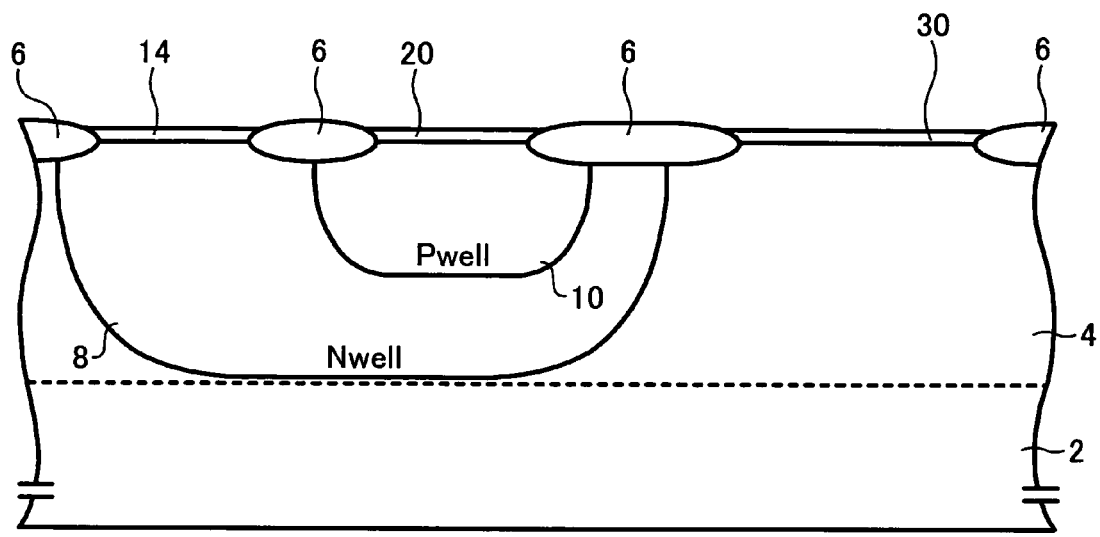
FIGS. 4E–4H are cross-sectional views illustrating an example of a second half of manufacturing processes of the embodiment shown in FIG. 3.
Figure 4F:
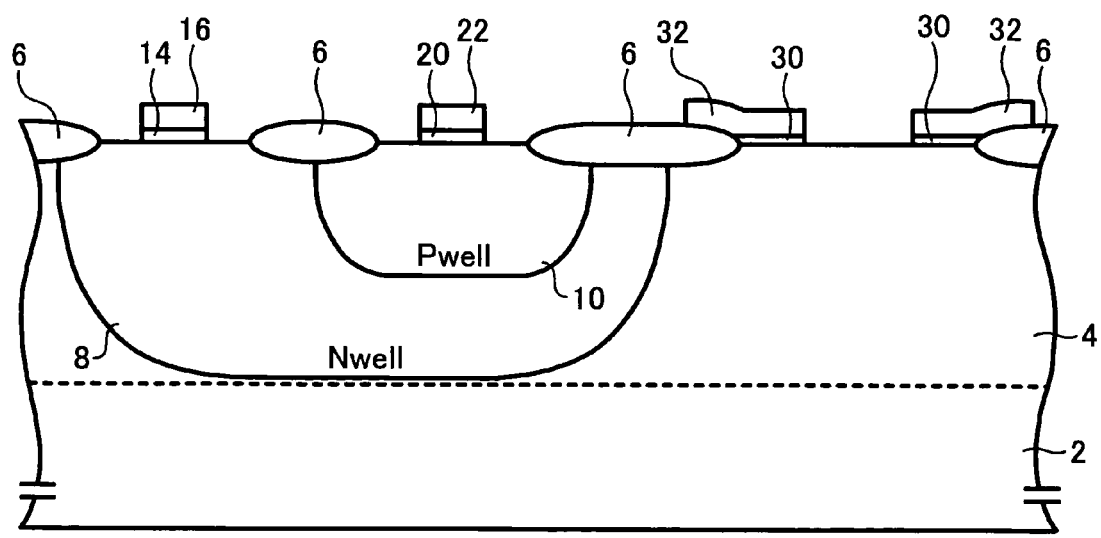
Figure 4G:
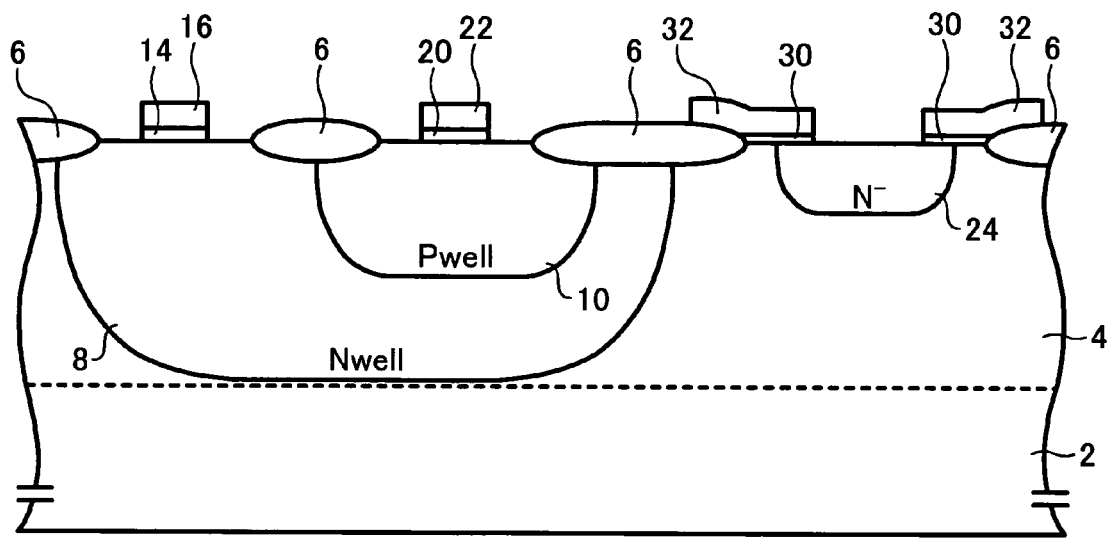

In Step 2, the P-type low concentration epitaxial layer 4, e.g., having resistivity of approximately 20 Ωcm and a thickness of 15 μm, is disposed on a surface of the P-type high concentration semiconductor substrate 2 (see FIG. 4B).

In Step 2, an N-type impurity (e.g., phosphorus) is selectively implanted by photolithography and ion implantation techniques into a CMOS formation region of the P-type low concentration epitaxial layer 4, e.g., an acceleration energy of 150 KeV and dose of approximately $1.0 \times 10^{13}$ cm$^{-2}$. For example, thermal processing is performed at a temperature of 1180° C. for approximately 14 hours, and then the implanted phosphorus is activated to form the Nwell region 8 (see FIG. 4C).

In Step 4, a P-type impurity (e.g., boron) is selectively implanted by photolithography and ion implantation techniques into a NchMOS transistor formation region of the Nwell region 8, e.g., an acceleration energy of 60 KeV and dose of approximately $5.0 \times 10^{12}$ cm$^{-2}$. For example, thermal processing is performed at a temperature of 1150° C. for approximately 8 hours, and then the implanted boron is activated to form the Pwell region 10 in the Nwell region 8 (see FIG. 4D).

In Step 5, the PchMOS and NchMOS transistors and the LOCOS oxide layers 6 are formed on a surface of the P-type low concentration epitaxial layer 4 by a normal LOCOS oxidation method. The PchMOS and NchMOS transistors form the CMOS. The LOCOS oxide layers 6 isolate the PchDMOS transistor formation region. The LOCOS oxide layers 6 have a thickness of approximately 800 nm, for example. A gate oxide layer 14 is formed on a surface of the Nwell region 8 surrounded by the LOCOS oxide layers 6 which is the PchMOS transistor formation region. A gate oxide layer 20 is formed on a surface of the Pwell region 10 surrounded by the LOCOS oxide layers 6 which is the NchMOS transistor formation region. A gate oxide layer 30 is formed on a surface of the P-type low concentration epitaxial layer 4 surrounded by the LOCOS oxide layers 6 which is the PchDMOS transistor formation region (see FIG. 4E).

In this case, a field dope diffusion layer which serves as a channel stopper may be formed under the LOCOS oxide layers 6.

In Step 6, a channel doping implant for determining a threshold voltage of the PchMOS transistor is performed by photolithography and ion implantation techniques on the surface of the Nwell region 8 which is the PchMOS transistor formation region. A channel doping implant for determining a threshold voltage of the NchMOS transistor is performed by photolithography and ion implantation techniques on the surface of the Pwell region 10 which is the NchMOS transistor formation region.

A polysilicon layer, e.g., having a thickness of approximately 500 nm, is deposited over the semiconductor substrate by chemical vapor deposition (CVD) techniques. Disposed on the polysilicon layer is an oxide layer (not shown), e.g., having a thickness of 200 nm. The oxide layer includes an opening corresponding to the NchMOS transistor formation region. Subsequently, an N-type polysilicon layer is formed by phosphorus deposition and thermal diffusion corresponding to the NchMOS transistor formation region. The polysilicon layer is patterned by photolithography and etching techniques to form a polysilicon-made gate electrode 16 over the PchMOS transistor formation region. An N-type polysilicon-made gate electrode 22 is formed over the NchMOS transistor formation region. A polysilicon-made gate electrode 32 is formed over the PchDMOS transistor formation region (see FIG. 4F).

In Step 7, the gate electrode 32 is masked by photolithography and ion implantation techniques to selectively implant an N-type impurity (e.g., phosphorus, an acceleration energy of 100 KeV and dose of approximately $3.0 \times 10^{13}$ cm$^{-2}$) into the P-type low concentration epitaxial layer 4 of the PchDMOS transistor formation region. For example, thermal processing is performed at a temperature of 1100° C. for approximately 3 hours, and then the implanted phosphorus is activated to form an N-channel diffusion layer 24. The N-channel diffusion layer 24 is self-aligned to the gate electrode 32 (see FIG. 4G).

Figure 4H:
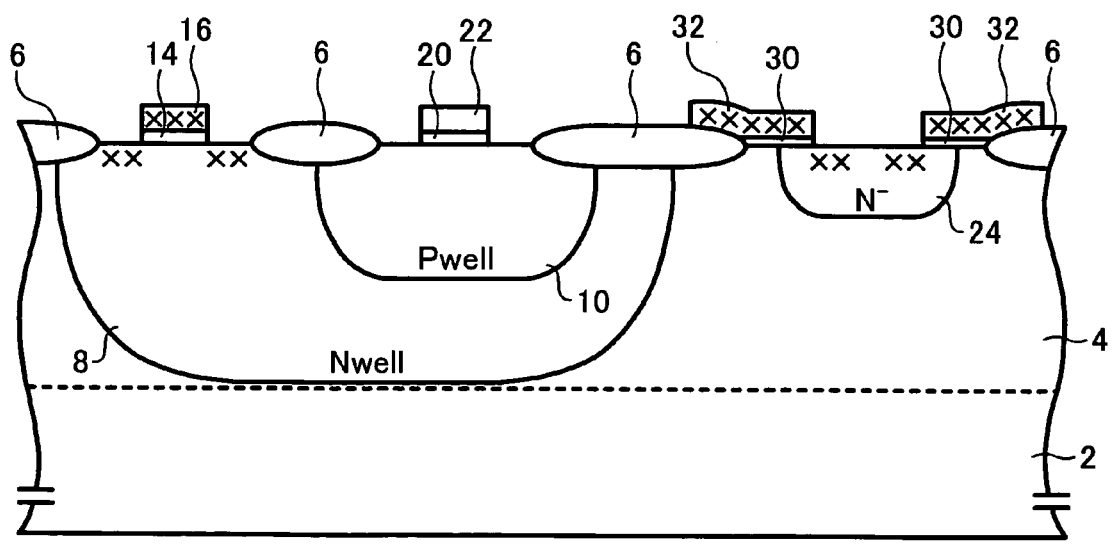

In Step 8, the gate electrodes 16 and 32 are masked by photolithography and ion implantation techniques to selectively implant a P-type impurity (e.g., boron, an acceleration energy of 30 KeV and dose of approximately $3.0 \times 10^{15}$ cm$^{-2}$) into source formation regions in the Nwell region 8 of the PchMOS transistor formation region and the N-channel diffusion layer 24 of the PchDMOS transistor formation region (see "X" marks in FIG. 4H). At this time, boron is also implanted in the gate electrodes 16 and 32.

In Step 9, the gate electrode 22 is masked by photolithography and ion implantation techniques to selectively implant an N-type impurity (e.g., phosphorus or arsenic, an acceleration energy of 50 KeV and dose of approximately $5.0 \times 10^{15}$ cm$^{-2}$) into the Pwell region 10 of the NchMOS transistor formation region and the N-type high concentration diffusion layer formation region of the N-channel diffusion layer 24 in the PchDMOS transistor formation region.

For example, thermal processing is performed at a temperature of 920° C. for approximately 60 minutes, and then the impurity is activated to form the P-type high concentration diffusion layers 12 serving as a source and a drain of the PchMOS transistor on the Nwell region 8. N-type high concentration diffusion layers 18 serving as a source and a drain of the NchMOS transistor are formed on the Pwell region 10. Subsequently, the N-type high concentration diffusion layer 28 and the P-type high concentration diffusion layers 26 serving as a source of the PchDMOS transistor are formed on the N-channel diffusion layer 24. In the thermal processing, boron implanted into the gate electrodes 16 and 32 is activated (in Step 8) to further lower a resistivity of the gate electrodes 16 and 32 (see FIG. 3).

Figure 5:
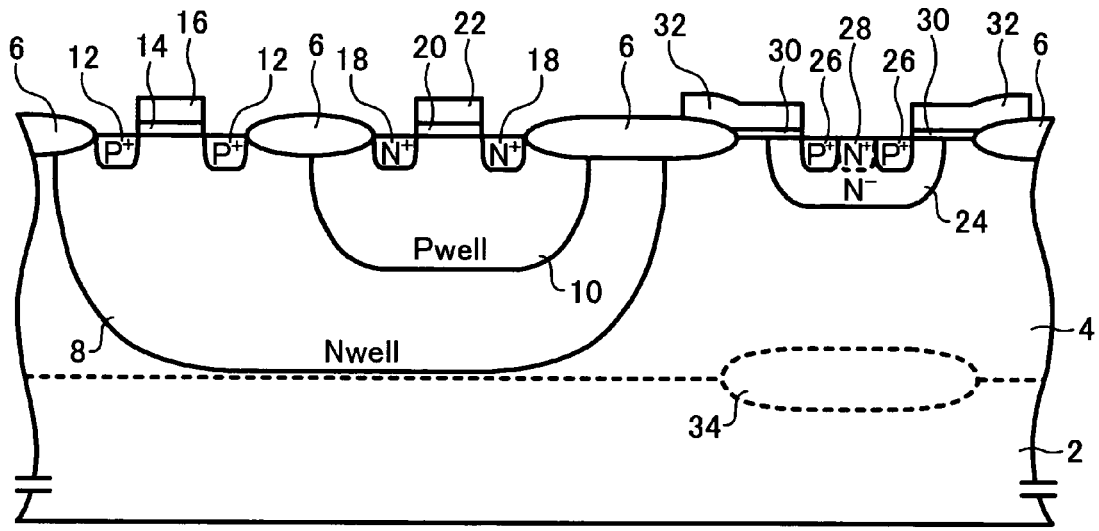
FIG. 5 is a cross-sectional view of a semiconductor device according to an embodiment of the present invention.

FIG. 5 is a cross-sectional view of a semiconductor device according to an embodiment of the present invention. In FIG. 5, the same reference numerals have been used to identify components which are the same functions as those in the embodiment of FIG. 3 and will be not be further explained.

The modification of this embodiment over that described in reference to FIG. 3 is that a P-type buried layer 34 is formed under the P-type high concentration diffusion layers 26 serving as a source of the PchDMOS transistor and at an interface of the P-type high concentration semiconductor substrate 2 and the P-type low concentration epitaxial layer 4.

Since the P-type buried layer 34 is disposed under the P-type high concentration diffusion layers 26 serving as a source of the PchDMOS transistor, the PchDMOS transistor is configured to set a drain resistance based on a device breakdown voltage, thereby reducing an on-resistance of the PchDMOS transistor.

In order to form the P-type buried layer 34, e.g., in Step 1 described with reference to FIG. 4A, boron is implanted on a predetermined region within the P-type high concentration semiconductor substrate 2, e.g., an acceleration energy of 50 KeV and dose of approximately $1.0 \times 10^{14}$ cm$^{-2}$. Subsequently, thermal processing is performed at a temperature of 1000° C. for approximately 60 minutes.

Figure 6:
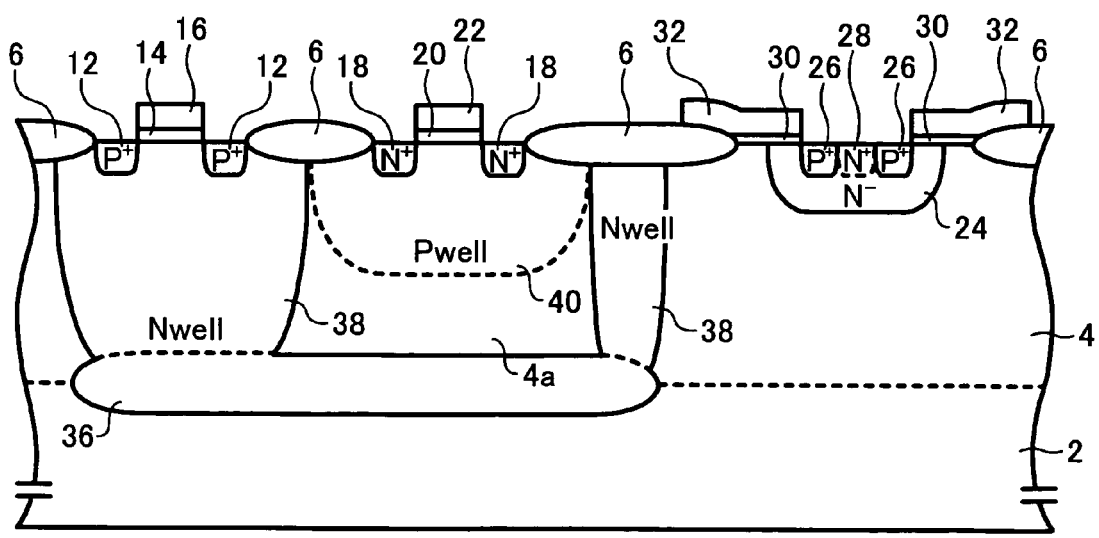
FIG. 6 is a cross-sectional view of a semiconductor device according to another embodiment of the present invention.

FIG. 6 is a cross-sectional view of a semiconductor device according to an embodiment of the present invention. In FIG. 6, the same reference numerals have been used to identify components which are the same functions as those in the embodiment of FIG. 3 and will be not be further explained.

The P-type high concentration semiconductor substrate 2 includes the P-type low concentration epitaxial layer 4 on the surface thereof. The P-type low concentration epitaxial layer 4 has the LOCOS oxide layers 6 for device isolation formed on its surface.

Corresponding to a CMOS formation region, an N-type buried layer 36 is disposed at an interface of the P-type high concentration semiconductor substrate 2 and the P-type low concentration epitaxial layer 4. Nwell regions 38 are formed on the P-type low concentration epitaxial layer 4. The Nwell regions 38 include the PchMOS transistor formation region and surround the NchMOS transistor formation region. A bottom of the Nwell regions 38 is electrically connected to the N-type buried layer 36. The N-type buried layer 36 and the Nwell regions 38 form the N-type region of the semiconductor device according to the present invention.

The Nwell regions 38 include the PchMOS transistor formed thereon. The PchMOS transistor includes the P-type high concentration diffusion layers 12 serves as a source and a drain, the gate oxide layer 14, and the gate electrode 16.

A Pwell region 40 is formed on a surface of a P-type low concentration epitaxial layer 4a (i.e., a first P-type low concentration epitaxial layer) surrounded by the N-type buried layer 36 and the Nwell regions 38. The Pwell region 40 is electrically isolated from the P-type low concentration epitaxial layer 4 and the P-type high concentration semiconductor substrate 2 in regions other than the P-type low concentration epitaxial layer 4a surrounded by the N-type buried layer 36 and the Nwell regions 38. The Pwell region 40 forms the P-type region of the semiconductor device according to the present invention.

The Pwell region 40 includes the NchMOS transistor formed thereon. The NchMOS transistor includes the N-type high concentration diffusion layers 18 which serve as a source and a drain, the gate oxide layer 20, and the gate electrode 22.

On a main surface of the P-type low concentration epitaxial layer 4 and in regions other than the CMOS formation region, the N-channel diffusion layer 24, the P-type high concentration diffusion layers 26, the N-type high concentration diffusion layer 28, the gate oxide layers 30, and the gate electrodes 32 for forming the PchDMOS transistor are formed. The P-type high concentration diffusion layers 26 serve as a source of the PchDMOS transistor. The P-type low concentration epitaxial layer 4 and the P-type high concentration semiconductor substrate 2 serve as a source and a drain of the PchDMOS transistor.

This embodiment will have similar effects as the embodiment described with reference to FIG. 3.

Further, since the N-type buried layer 36 is disposed corresponding to the CMOS formation region, the CMOS formation region is electrically isolated from the P-type high concentration semiconductor substrate 2 in vertical direction. This structure eliminates a lack in an isolated withstand voltage and a latch-up attributable to a parasitic bipolar structure so that a high voltage product can be made.

[0065] The N-type region has its bottom formed in the N-type buried layer 36 and its side formed in the Nwell regions 38. The N-type region surrounds the P-type low concentration epitaxial layer 4a including the Pwell region 40 which is the NchMOS transistor formation region. The P-type region is formed on the P-type low concentration epitaxial layer 4a surrounded by the N-type regions. As a result, the P-type low concentration epitaxial layer 4a is electrically isolated from the P-type high concentration semiconductor substrate 2. The CMOS transistor (i.e., the PchMOS transistor formed in the Nwell regions 38 and the NchMOS transistor formed in the Pwell region 40 included in the P-type low concentration epitaxial layer 4a) can form a circuit only by setting a voltage on a surface of the semiconductor substrate. In this case, the P-type high concentration semiconductor substrate 2 which is a drain of the PchDMOS transistor can serve as an output terminal.

FIGS. 7A–7H are cross-sectional views explaining an exemplary manufacturing processes of the embodiment shown in FIG. 6.

In Step 1, the P-type high concentration semiconductor substrate 2 having resistivity of less than approximately 0.1 Ωcm is prepared. An N-type impurity (e.g., phosphorus or arsenic) is selectively implanted by photolithography and ion implantation techniques into a CMOS formation region on a surface of the P-type high concentration semiconductor substrate 2, e.g., an acceleration energy of 50 KeV and dose of approximately $1.0 \times 10^{15}$ cm$^{-2}$. For example, thermal processing is performed at a temperature of 1000° C. for approximately 60 hours, and then the implanted impurity is activated to form the Nwell region 36 (see FIG. 7A).

In Step 2, the P-type low concentration epitaxial layer 4, e.g., having a resistivity of approximately 20 Ωcm and a thickness of 15 μm, is disposed on a surface of the P-type high concentration semiconductor substrate 2. At this time, the impurity in the N-type buried layer 36 also diffuses into the P-type low concentration epitaxial layer 4 (see FIG. 7B).

In Step 3, an N-type impurity (e.g., phosphorus) is selectively implanted by photolithography and ion implantation techniques into a CMOS formation region in the P-type low concentration epitaxial layer 4, e.g., an acceleration energy of 150 KeV and dose of approximately $1.0 \times 10^{13}$ cm$^{-2}$. That is, the N-type impurity is implanted into the CMOS formation region so as to include the PchMOS transistor formation region and surround the NchMOS transistor formation region. For example, thermal processing is performed at a temperature of 1180° C. for approximately 14 hours, and then the implanted phosphorus is activated to form the Nwell regions 38.

In the thermal processing, the N-type impurity in the Nwell regions 38 is diffused in a depth direction while the N-type impurity in the Nwell region 36 is expanded upward. As a result, the N-type buried layer 36 is electrically connected to the Nwell regions 38. The P-type low concentration epitaxial layer 4a (i.e., the NchMOS transistor formation region), surrounded by the N-type buried layer 36 and the Nwell regions 38, is electrically isolated from the P-type low concentration epitaxial layer 4 and the P-type high concentration semiconductor substrate 2 (see FIG. 7C).

Figure 8A:
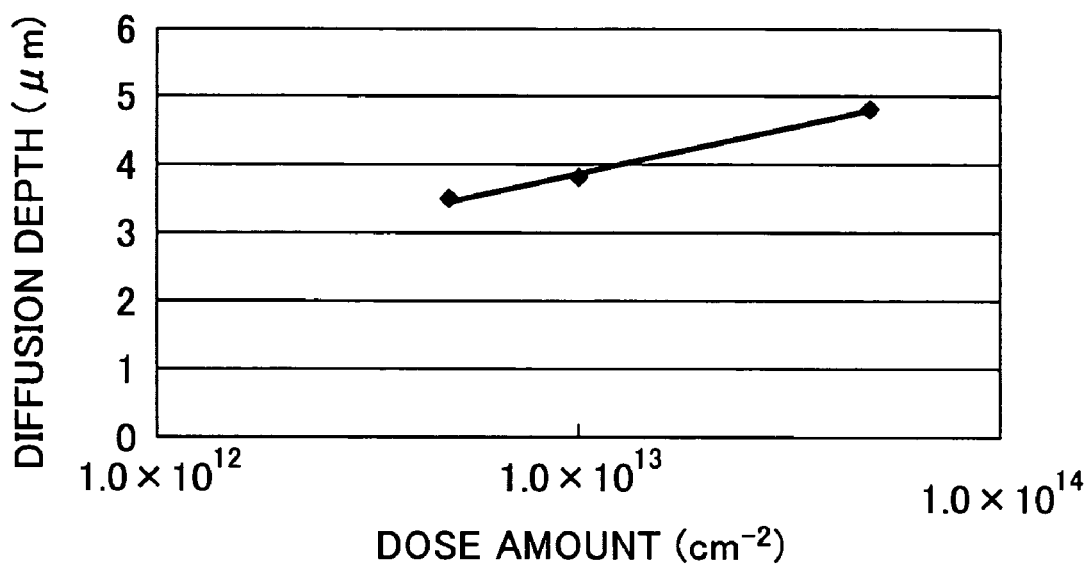
FIGS. 8A and 8B illustrate a relationship between a dose and a diffusion depth of phosphorus implanted from a surface when an impurity is diffused by a thermal processing.
Figure 8B:
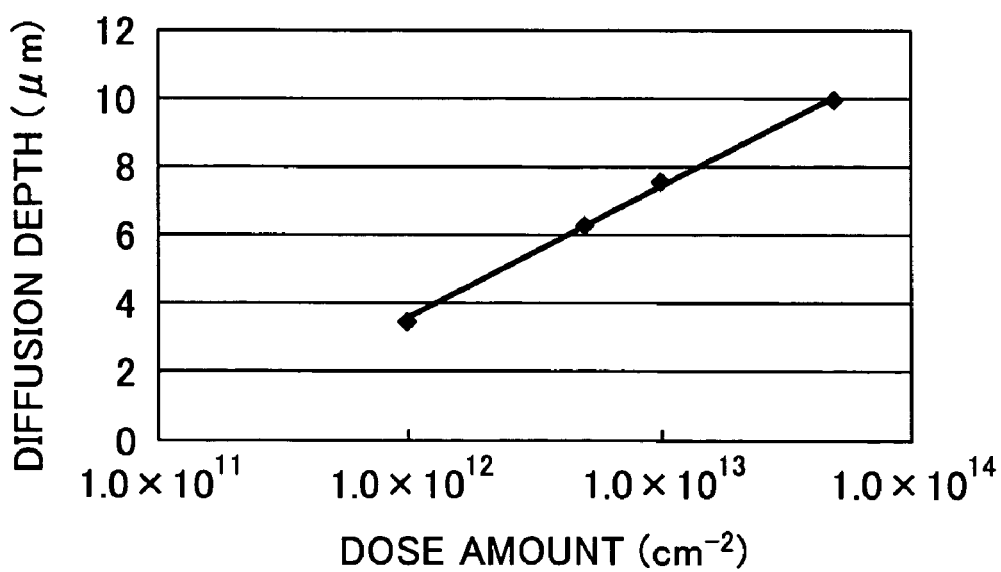
Figure 8C:
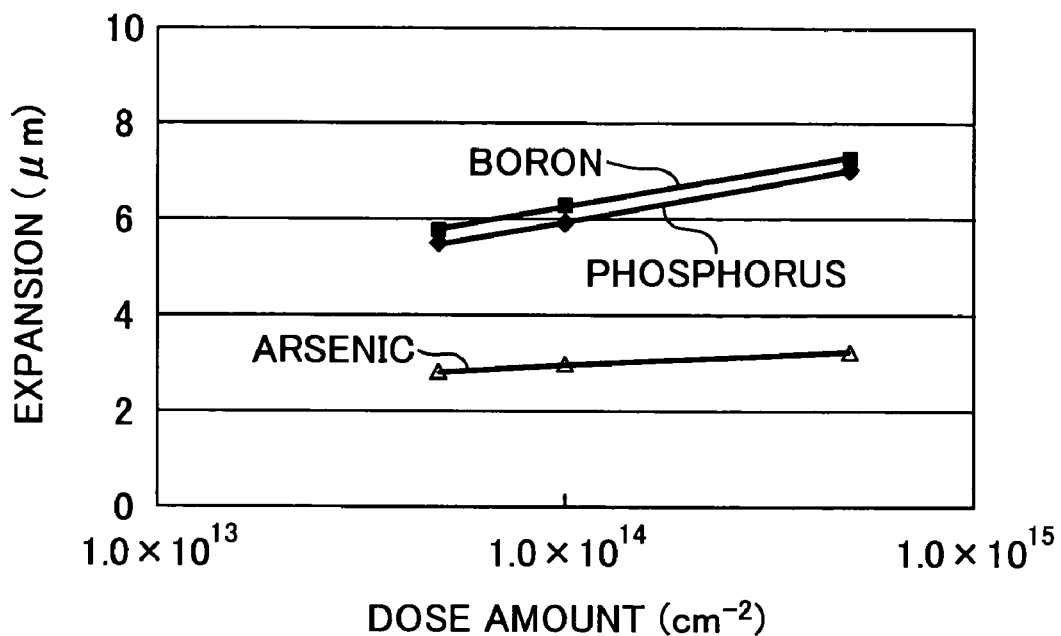
FIGS. 8C and 8D illustrate a relationship between a dose and an upward expansion of a buried layer when an impurity is diffused by a thermal processing.
Figure 8D:
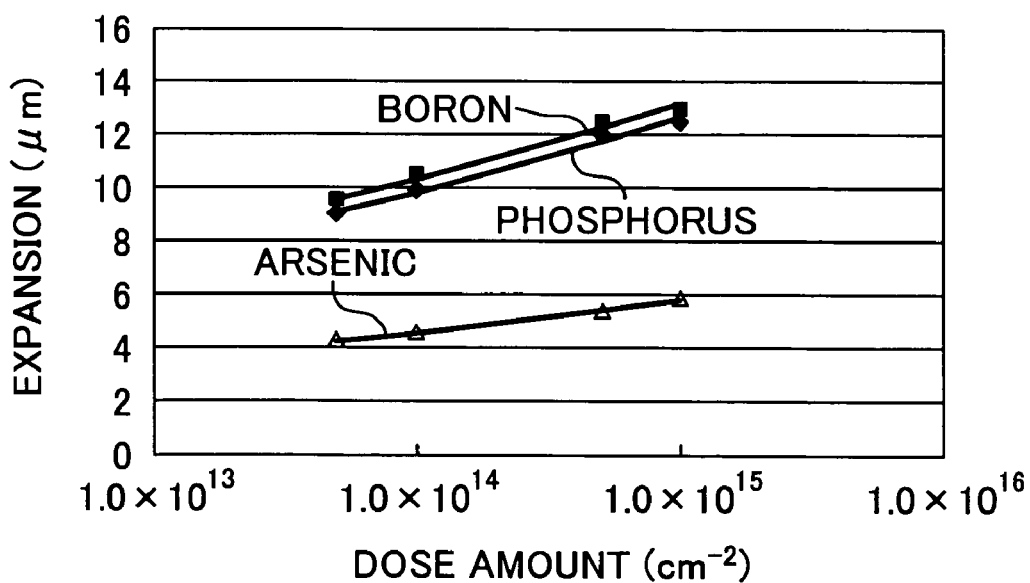

FIGS. 8A–8D illustrate data describing a diffusion of an impurity by thermal processing. FIGS. 8A and 8B illustrate a relationship between a dose and a diffusion depth of phosphorus implanted from the surface. FIGS. 8C and 8D illustrate a relationship between a dose and an upward expansion of a buried layer by using boron, phosphorus, and arsenic. Thermal processing in FIGS. 8A and 8C is 1150 and 500 minutes. Thermal processing in FIGS. 8B and 8D is 1180 and 860 minutes.

Using information of the diffusion depth from the surface and an upward expansion of the buried layer obtained from FIGS. 8A–8D ensure that the N-type buried layer 36 is electrically connected to the Nwell regions 38 while the NchMOS transistor formation region is electrically isolated from the P-type low concentration epitaxial layer 4 and the P-type high concentration semiconductor substrate 2.

In Step 4, a P-type impurity (e.g., boron) is selectively implanted by photolithography and ion implantation techniques into the P-type low concentration epitaxial layer 4a (i.e., the NchMOS transistor formation region), surrounded by the N-type buried layer 36 and the Nwell regions 38, e.g., an acceleration energy of 50 KeV and dose of approximately $3.0 \times 10^{12}$ cm$^{-2}$. For example, thermal processing is performed at a temperature of 1150° C. for approximately 8 hours, and then the implanted boron is activated to form the Pwell region 40 in the P-type low concentration epitaxial layer 4a (see FIG. 7D).

Figure 7A:
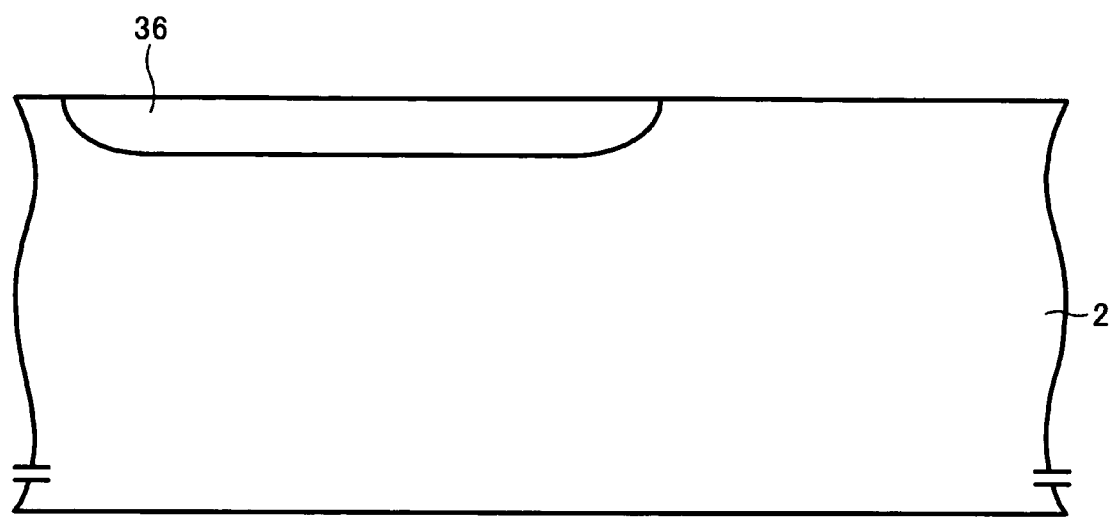
FIGS. 7A–7D are cross-sectional views illustrating an example of a first half of manufacturing processes of the embodiment shown in FIG. 6.
Figure 7B:
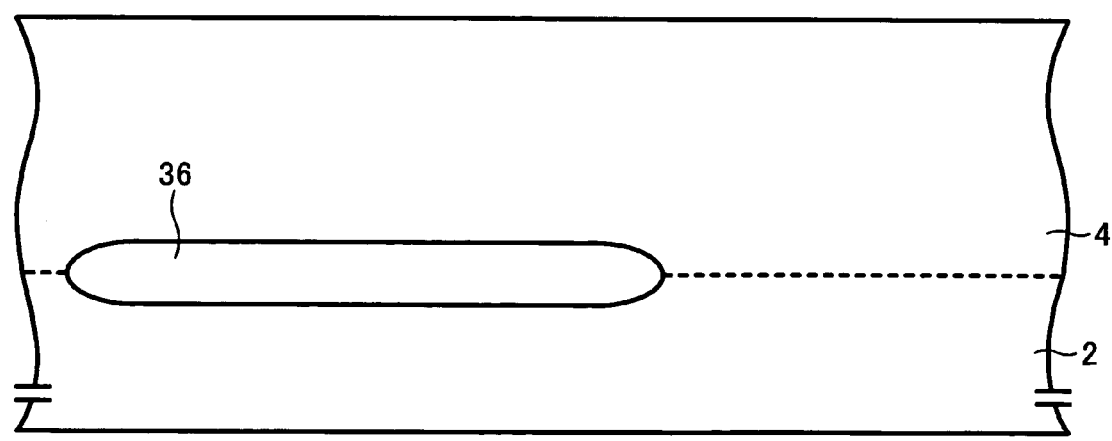
Figure 7C:
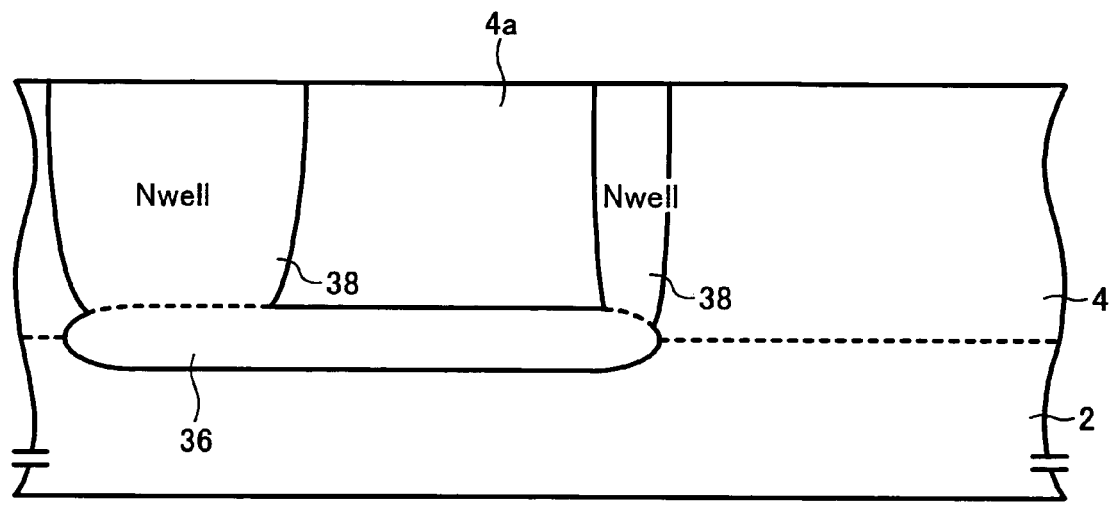
Figure 7D:
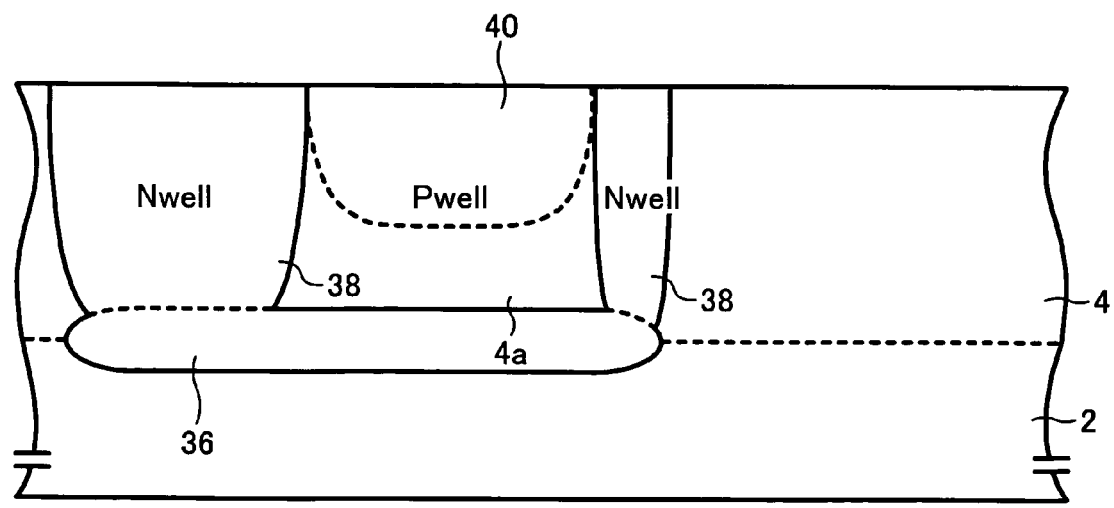
Figure 7E:
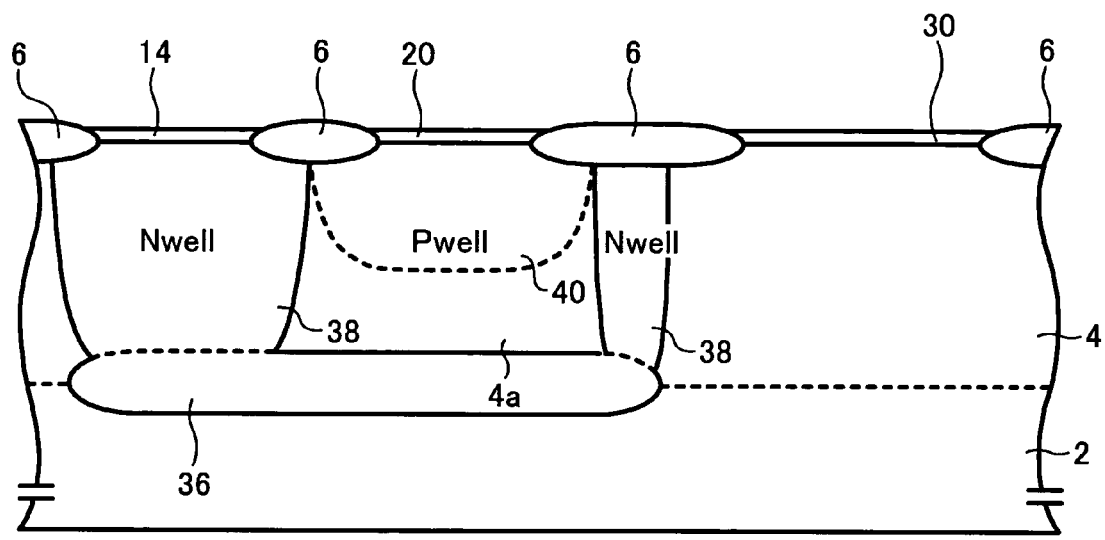
FIGS. 7E–7H are cross-sectional views illustrating an example of a second half of manufacturing processes of the embodiment shown in FIG. 6.
Figure 7F:
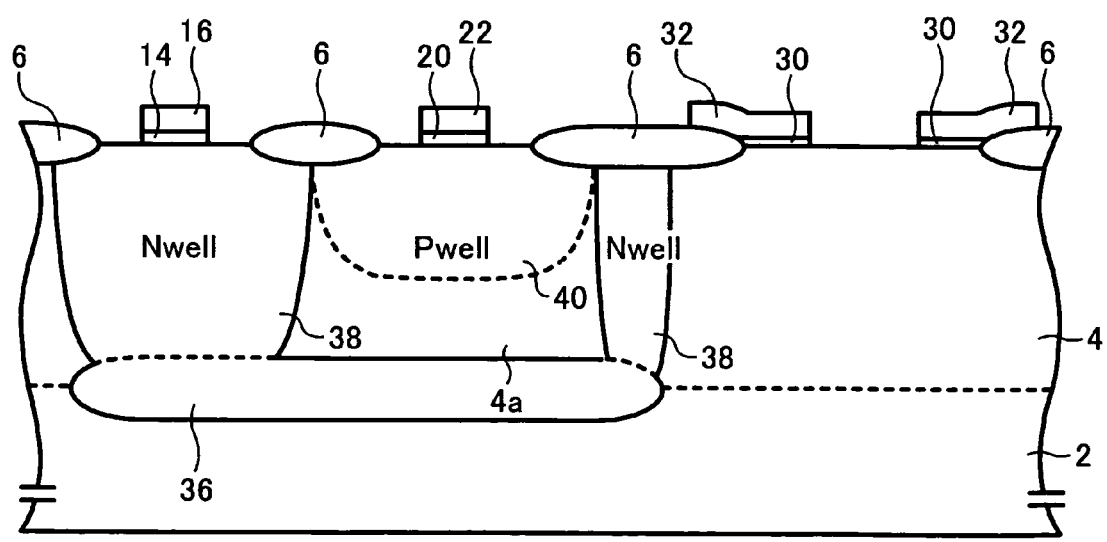
Figure 7G:
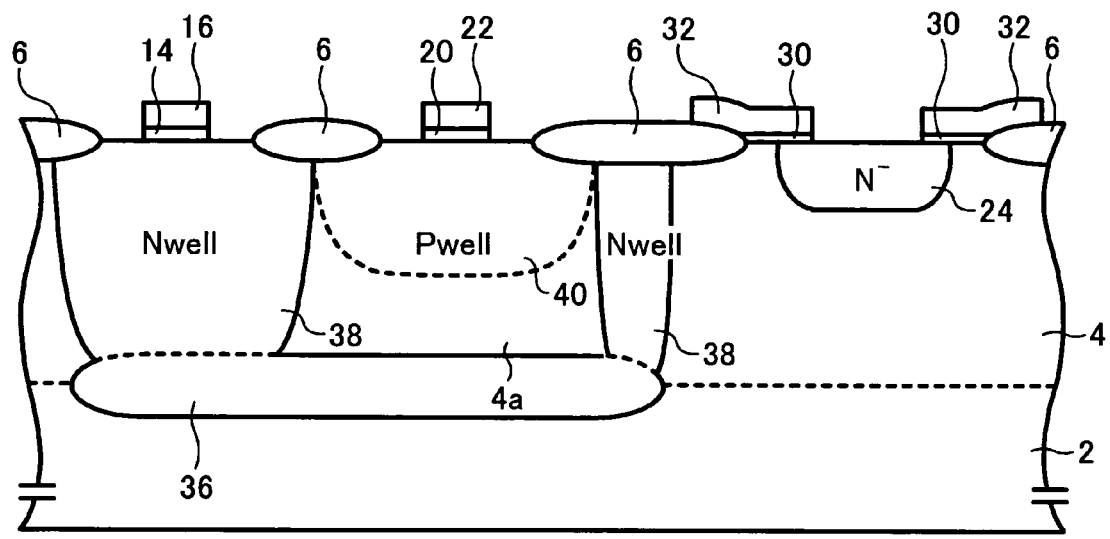
Figure 7H:
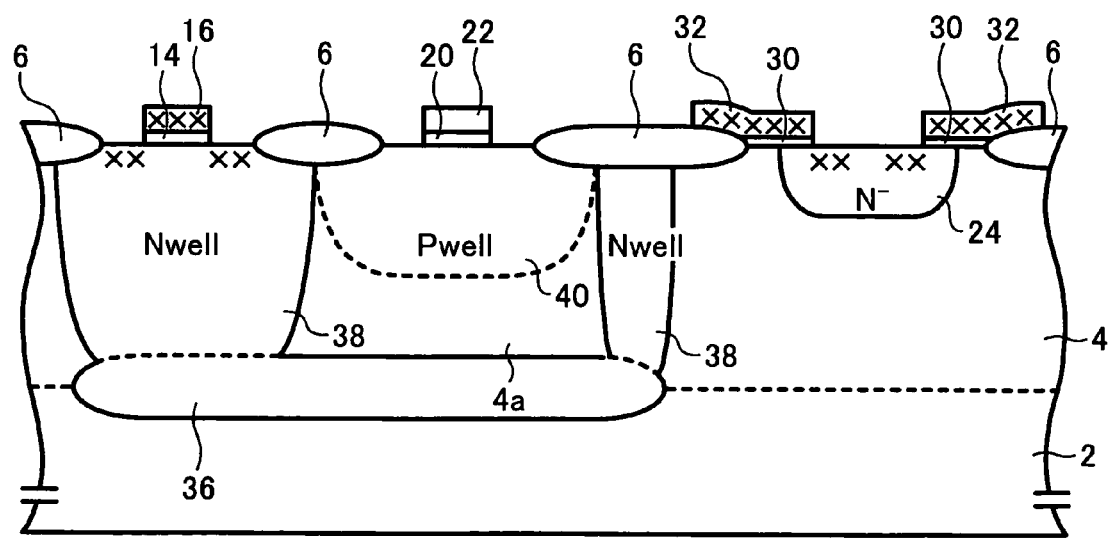

In Step 5, in a similar manner to the above-mentioned Steps 5 to 9 described with reference to FIGS. 4E–4H and FIG. 3, the LOCOS oxide layers 6 and the gate oxide layers 14, 20, and 30 are formed (see FIG. 7E). After a channel doping implant to the PchMOS transistor and the NchMOS transistor, gate electrodes 16, 22, and 32 are formed (see FIG. 7F), followed by formation of the N-channel diffusion layer 24 (see FIG. 7G). The P-type impurity is selectively implanted into source formation regions in the Nwell regions 38 which is the PchMOS transistor formation region and the N-channel diffusion layer 24 which is the PchDMOS transistor formation region (see FIG. 7h). The N-type impurity is selectively implanted into the Pwell region 40 which is the NchMOS transistor formation region and the N-type high concentration diffusion layer formation region in the N-channel diffusion layer 24 which is the PchDMOS formation region. Thermal processing is then performed to form the P-type high concentration diffusion layers 12 and 26 and the N-type high concentration diffusion layers 18 and 28 (see FIG. 6).

Figure 9:
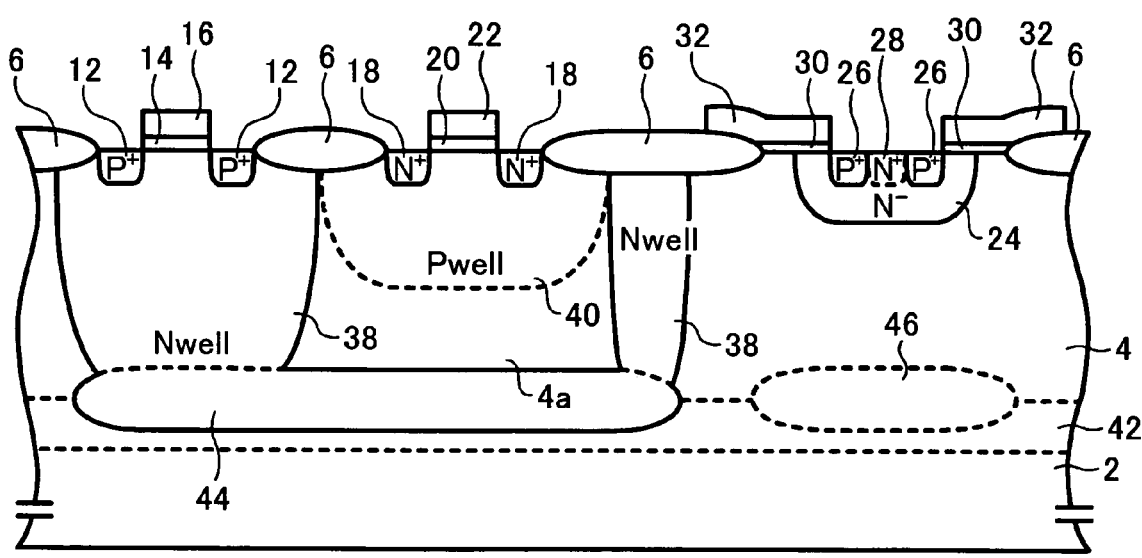
FIG. 9 is a cross-sectional view of a semiconductor device according to another embodiment of the present invention.

FIG. 9 is a cross-sectional view of a semiconductor device according to another embodiment of the present invention. In FIG. 9, the same reference numerals have been used to identify components which are the same functions as those in the embodiment of FIG. 6 and will be not be further explained.

The P-type high concentration semiconductor substrate 2 has a P-type low concentration epitaxial layer 42 (i.e., a second P-type low concentration epitaxial) and the P-type low concentration epitaxial layer 4 formed thereon sequentially from bottom to top. The P-type low concentration epitaxial layer 42 has a thickness of approximately 10 μm and a resistivity of approximately 20 Ωcm. The P-type low concentration epitaxial layer 4 includes LOCOS oxide layers 6 for device isolation on the surface thereof.

Disposed at an interface of the P-type low concentration epitaxial layers 42 and 4 is an N-type buried layer 44 corresponding to the CMOS formation region. At the interface of the P-type low concentration epitaxial layers 42 and 4, a P-type buried layer 46 is disposed under the P-type high concentration diffusion layers 26 which forms a source of the PchDMOS transistor.

Nwell regions 38 are formed in the P-type low concentration epitaxial layer 4. The Nwell regions 38 include the PchMOS transistor formation region and surround the NchMOS transistor formation region.

A bottom of the Nwell regions 38 is electrically connected to the N-type buried layer 44. The N-type buried layer 44 and the Nwell regions 38 form the N-type region of the semiconductor device according to the present invention.

The Nwell regions 38 include the PchMOS transistor formed thereon. The PchMOS transistor includes the P-type high concentration diffusion layers 12 which serve as a source and a drain, the gate oxide layer 14, and the gate electrode 16.

A Pwell region 40 is formed on a surface of the P-type low concentration epitaxial layer 4a surrounded by the N-type buried layer 44 and the Nwell regions 38.

The Pwell region 40 includes an NchMOS transistor formed thereon. The NchMOS transistor includes the N-type high concentration diffusion layers 18 which serve as a source and a drain, the gate oxide layer 20, and the gate electrode 22.

On a main surface of the P-type low concentration epitaxial layer 4 and in regions other than the CMOS formation region, the N-channel diffusion layer 24, the P-type high concentration diffusion layers 26, the N-type high concentration diffusion layer 28, the gate oxide layers 30, and the gate electrodes 32 are formed so as to form the PchDMOS transistor.

The P-type high concentration diffusion layers 26 serve as a source of the PchDMOS transistor. The P-type high concentration semiconductor substrate 2, the P-type low concentration epitaxial layers 4 and 42, and the P-type buried layer 46 serve as a drain of the PchDMOS transistor.

This embodiment will have similar effects as the embodiments described with reference to FIGS. 3 and 6. Further, in a similar manner to the embodiment described with reference to FIG. 5, a formation of the P-type buried layer 46 reduces a drain resistance of the PchDMOS transistor.

The N-type buried layer 44, disposed at an interface of the P-type low concentration epitaxial layers 4 and 42, is spaced from the P-type high concentration semiconductor substrate 2. This structure enables the P-type low concentration epitaxial layer 42 to absorb an elevated portion of the P-type impurity in the P-type high concentration semiconductor substrate 2 at the time of thermal processing in a production process, further forming more rigid N-type buried layer 44. In addition, a loss of the N-type buried layer 44, caused by expanding and diffusing the P-type impurity in the P-type high concentration semiconductor substrate 2, is eliminated. This structure also eliminates an incomplete electrical isolation of the semiconductor substrate and the Pwell region 40. This is caused by the fact that the P-type impurity in the P-type high concentration semiconductor substrate 2 is diffused to the top of the N-type buried layer 44 and the bottom surface of the Nwell regions 38, formed from a main surface, does not contact the N-type buried layer 44. As a result, the semiconductor substrate has a high withstand voltage and a latch-up resistant structure.

FIGS. 10A–10H are cross-sectional views explaining an exemplary manufacturing processes of the embodiment shown in FIG. 9.

In Step 1, the P-type high concentration semiconductor substrate 2 having resistivity of less than approximately 0.1 Ωcm is prepared. The P-type low concentration epitaxial layer 42, e.g., having a resistivity of approximately 20 Ωcm and a thickness of 10 μm, is disposed on a surface of the P-type high concentration semiconductor substrate 2. An N-type impurity (e.g., phosphorus or arsenic) is selectively implanted by photolithography and ion implantation techniques into a surface of the P-type low concentration epitaxial layer 42 corresponding to a CMOS formation region of a surface of the P-type high concentration semiconductor substrate 2, e.g., an acceleration energy of 50 KeV and dose of approximately $1.0 \times 10^{15}$ cm$^{-2}$. Subsequently, a P-type impurity (e.g., boron) is selectively implanted into a source formation region for the PchDMOS transistor, e.g., an acceleration energy of 50 KeV and dose of approximately $1.0 \times 10^{14}$ cm$^{-2}$. For example, thermal processing is performed at a temperature of 1000° C. for approximately 60 hours, and then the implanted P-type and N-type impurities are activated to form the N-type buried layer 44 and the P-type buried layer 46 (see FIG. 10A).

In Step 2, the P-type low concentration epitaxial layer 4, e.g., having a resistivity of approximately 20 Ωcm and a thickness of 15 μm, is disposed on the P-type low concentration epitaxial layer 42. At this time, the impurities in the N-type buried layer 44 and the P-type buried layer 46 also diffuse into the P-type low concentration epitaxial layer 4 (see FIG. 10B).

Figure 10A:
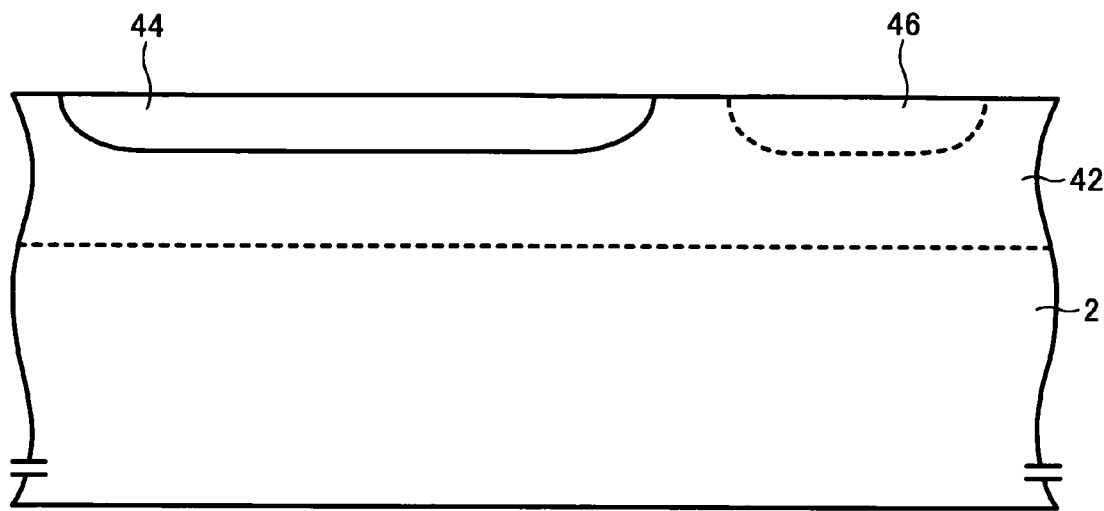
FIGS. 10A–10D are cross-sectional views illustrating an example of a first half of manufacturing processes of the embodiment shown in FIG. 9.
Figure 10B:
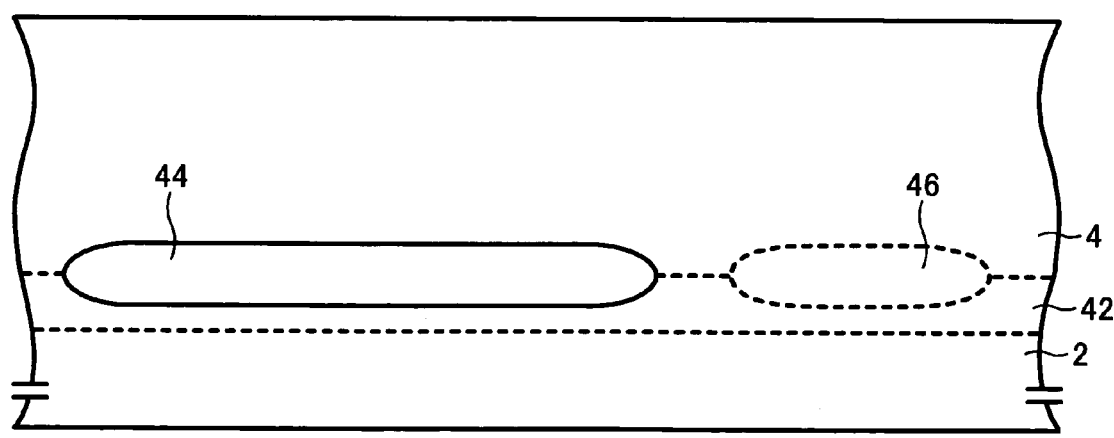
Figure 10C:
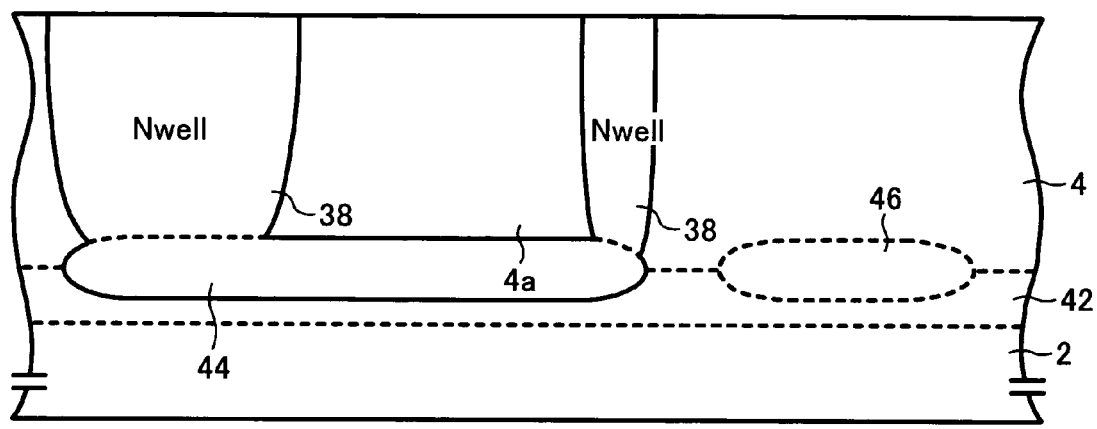
Figure 10D:
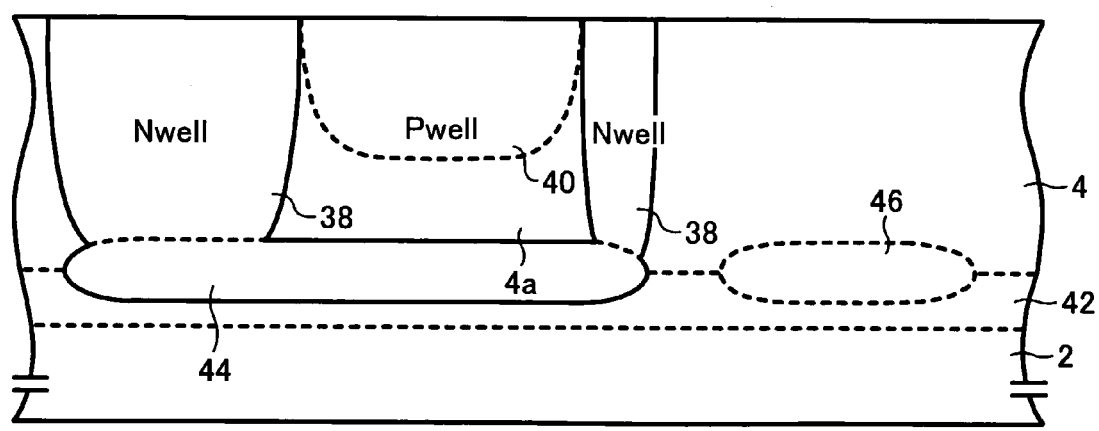
Figure 10E:
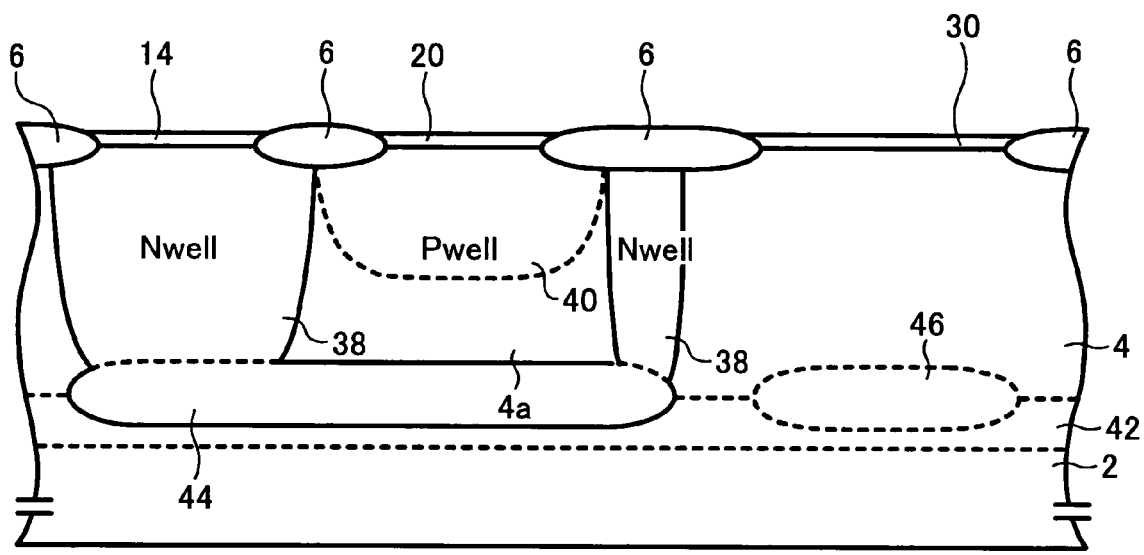
FIGS. 10E–10H are cross-sectional views illustrating an example of a second half of manufacturing processes of the embodiment shown in FIG. 9.
Figure 10F:
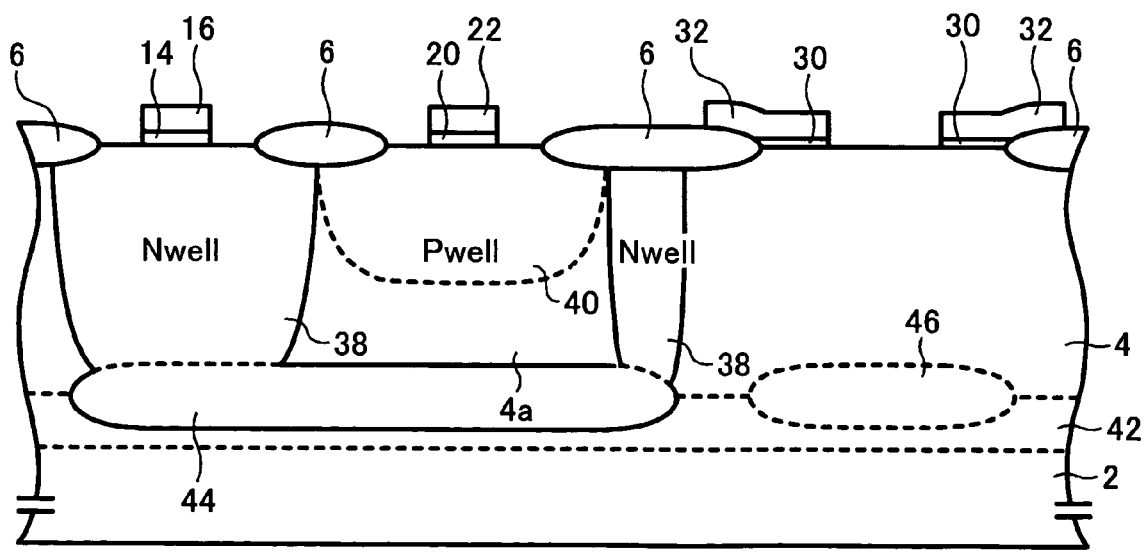
Figure 10G:
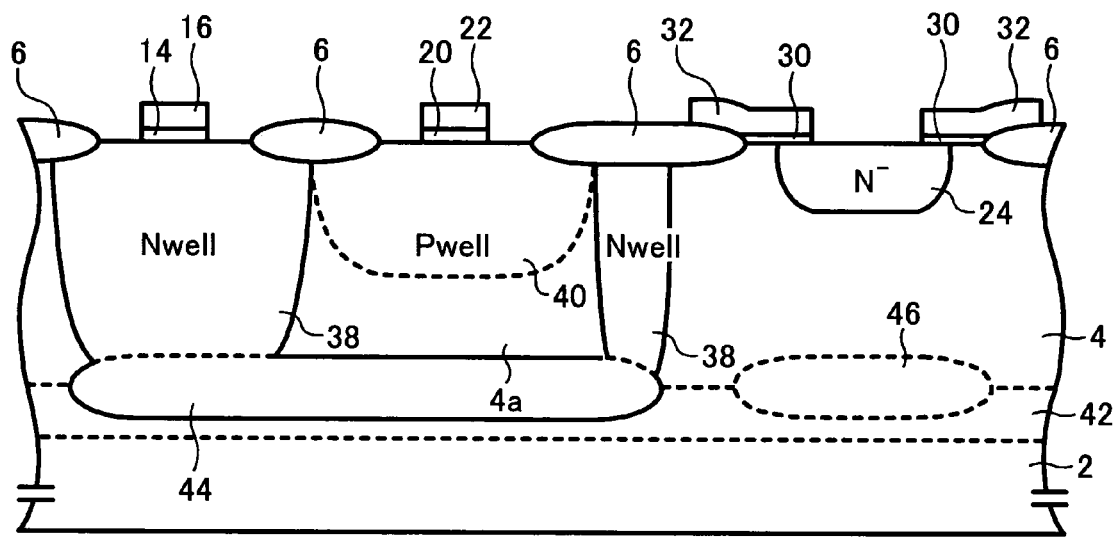
Figure 10H:
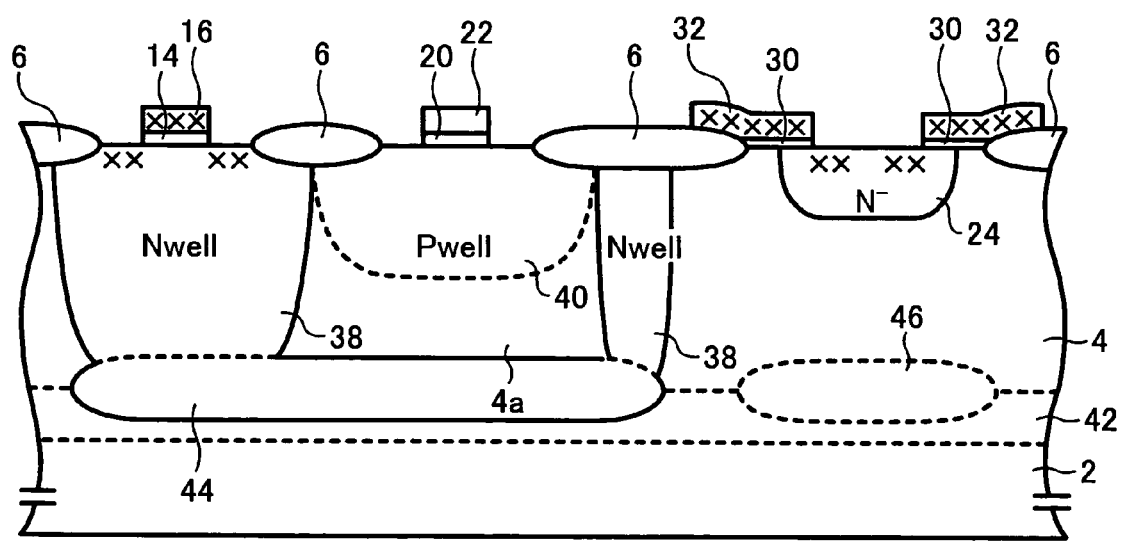

In Step 3, in a similar manner to the above-mentioned Steps 3 and 4 described with reference to FIGS. 7C and 7D, the Nwell regions 38 is formed into the P-type low concentration epitaxial layer 4 (see FIG. 10C). The Pwell region 40 is formed in the P-type low concentration epitaxial layer 4a surrounded by the N-type buried layer 44 and the Nwell regions 38 (see FIG. 10D).

In Step 4, in a similar manner to the above-mentioned Steps 5 to 9 described with reference to FIGS. 4E–4H and FIG. 3, the LOCOS oxide layers 6 and the gate oxide layers 14, 20, and 30 are formed (see FIG. 1E). After a channel doping implant to the PchMOS transistor and the NchMOS transistor, gate electrodes 16, 22, 32 are formed (see FIG. 10F), followed by formation of the N-channel diffusion layer 24 (see FIG. 11G). The P-type impurity is selectively implanted into source formation regions in the Nwell regions 38 which is the PchMOS transistor formation region and the N-channel diffusion layer 24 which is the PchDMOS transistor formation region (see FIG. 10h). The Nx-type impurity is selectively implanted into the Pwell region 40 which is the NchMOS transistor formation region and the N-type high concentration diffusion layer formation region in the N-channel diffusion layer 24 which is the PchDMOS transistor formation region. Thermal processing is then performed to form the P-type high concentration diffusion layers 12 and 26 and the N-type high concentration diffusion layers 18 and 28 (see FIG. 9).

Figure 11:
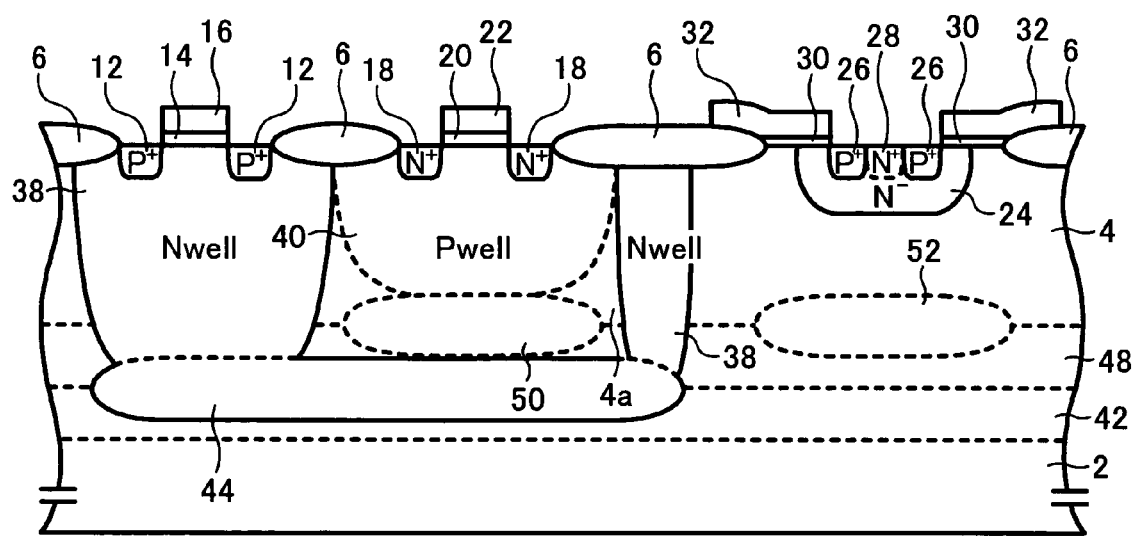
FIG. 11 is a cross-sectional view of a semiconductor device according to another embodiment of the present invention.

FIG. 11 is a cross-sectional view of a semiconductor device according to another embodiment of the present invention. In FIG. 11, the same reference numerals have been used to identify components which are the same functions as those in the embodiment of FIG. 9 and will be not be further explained.

The P-type high concentration semiconductor substrate 2 has the P-type low concentration epitaxial layer 42, a P-type low concentration epitaxial layer 48 (i.e., a third P-type low concentration epitaxial), and the P-type low concentration epitaxial layer 4 formed thereon sequentially from bottom to top. The P-type low concentration epitaxial layer 48 has a thickness of approximately 10 μm and a resistivity of approximately 20 Ωcm. The P-type low concentration epitaxial layer 4 includes LOCOS oxide layers 6 for device isolation on the surface thereof.

Disposed at an interface of the P-type low concentration epitaxial layers 42 and 48 is an N-type buried layer 44 corresponding to the CMOS formation region.

Disposed at an interface of the P-type low concentration epitaxial layers 4 and 48 is a P-type buried layer 50 corresponding to the NchMOS transistor formation region. In addition, disposed at the interface of the P-type low concentration epitaxial layers 4 and 48 is also a P-type buried layer 52 under the P-type high concentration diffusion layers 26 which forms a source of a PchDMOS transistor.

Nwell regions 38 are formed in the P-type low concentration epitaxial layers 4 and 48. The Nwell regions 38 include the PchMOS transistor formation region and surround the NchMOS transistor formation region. A bottom of the Nwell regions 38 is electrically connected to the N-type buried layer 44. The P-type buried layer 50 is electrically isolated from the P-type high concentration semiconductor substrate 2 by the Nwell regions 38 and the N-type buried layer 44.

The Nwell regions 38 include the PchMOS transistor formed thereon. The PchMOS transistor includes the P-type high concentration diffusion layers 12 which serve as a source and a drain, the gate oxide layer 14, and the gate electrode 16.

A Pwell region 40 is formed on a surface of the P-type low concentration epitaxial layer 4a surrounded by the N-type buried layer 44 and the Nwell regions 38.

The Pwell region 40 includes an NchMOS transistor formed thereon. The NchMOS transistor includes the N-type high concentration diffusion layers 18 which serve as a source and a drain, the gate oxide layer 20, and the gate electrode 22.

On a main surface of the P-type low concentration epitaxial layer 4 and in regions other than the CMOS formation region, the N-channel diffusion layer 24, the P-type high concentration diffusion layers 26, the N-type high concentration diffusion layer 28, the gate oxide layers 30, and the gate electrodes 32 are formed so as to form the PchDMOS transistor. The P-type high concentration diffusion layers 26 serve as a source of the PchDMOS transistor. The P-type high concentration semiconductor substrate 2, the P-type low concentration epitaxial layers 4, 42 and 48, and the P-type buried layer 52 serve as a drain of the PchDMOS transistor.

This embodiment will have similar effects as the embodiments described with reference to FIGS. 3 and 6. Further, in a similar manner to the embodiment described with reference to FIG. 5, a formation of the P-type buried layer 52 reduces a drain resistance of the PchDMOS transistor.

The N-type buried layer 44 is disposed at an interface of the P-type low concentration epitaxial layers 42 and 48, and the P-type buried layer 50 is disposed at an interface of the P-type low concentration epitaxial layers 4 and 48 corresponding to the Pwell region 40 formation region. In the Pwell region 40 formation region (i.e., the NchMOS transistor formation region), the upward diffusion of the N-type buried layer 44 is absorbed by the P-type low concentration epitaxial layers 48 and the P-type buried layer 50, so that the Pwell region 40 has a sufficient "well" withstand voltage without forming a high concentration well region. This technique prevents an increase in a threshold voltage of the NchMOS transistor formed in the Pwell region 40 and is applicable to high voltage devices.

FIGS. 12A–12H are cross-sectional views explaining an exemplary manufacturing processes of the embodiment shown in FIG. 11.

In Step 1, the P-type high concentration semiconductor substrate 2 having resistivity of less than approximately 0.1 Ωcm is prepared. The P-type low concentration epitaxial layer 42, e.g., having a resistivity of approximately 20 Ωcm and a thickness of 10 μm, is disposed on a surface of the P-type high concentration semiconductor substrate 2. An N-type impurity (e.g., phosphorus or arsenic) is selectively implanted by photolithography and ion implantation techniques into a surface of the P-type low concentration epitaxial layer 42 corresponding to a CMOS formation region on a surface of the P-type high concentration semiconductor substrate 2, e.g., an acceleration energy of 50 KeV and dose of approximately $1.0 \times 10^{15}$ cm$^{-2}$. For example, thermal processing is performed at a temperature of 1000° C. for approximately 60 hours, and then the implanted N-type impurity is activated to form the N-type buried layer 44 (see FIG. 12A).

In Step 2, the P-type low concentration epitaxial layer 48, e.g., having a resistivity of approximately 20 Ωcm and a thickness of 10 μm, is disposed on the P-type low concentration epitaxial layer 42. At this time, the impurity in the N-type buried layer 44 also diffuses into the P-type low concentration epitaxial layer 48. An P-type impurity (e.g., boron) is selectively implanted by photolithography and ion implantation techniques into a surface of the P-type low concentration epitaxial layer 48 corresponding to a source formation region for the PchDMOS transistor and the NchMOS transistor formation region, e.g., an acceleration energy of 50 KeV and dose of approximately $1.0 \times 10^{14}$ cm$^{-2}$.

Figure 12A:
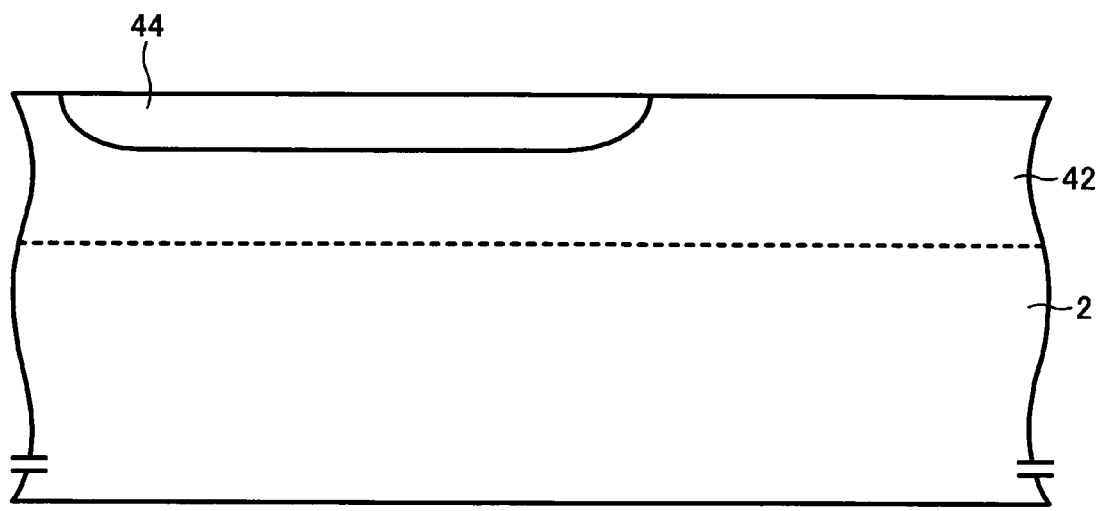
FIGS. 12A–12D are cross-sectional views illustrating an example of a first half of manufacturing processes of the embodiment shown in FIG. 11.
Figure 12B:
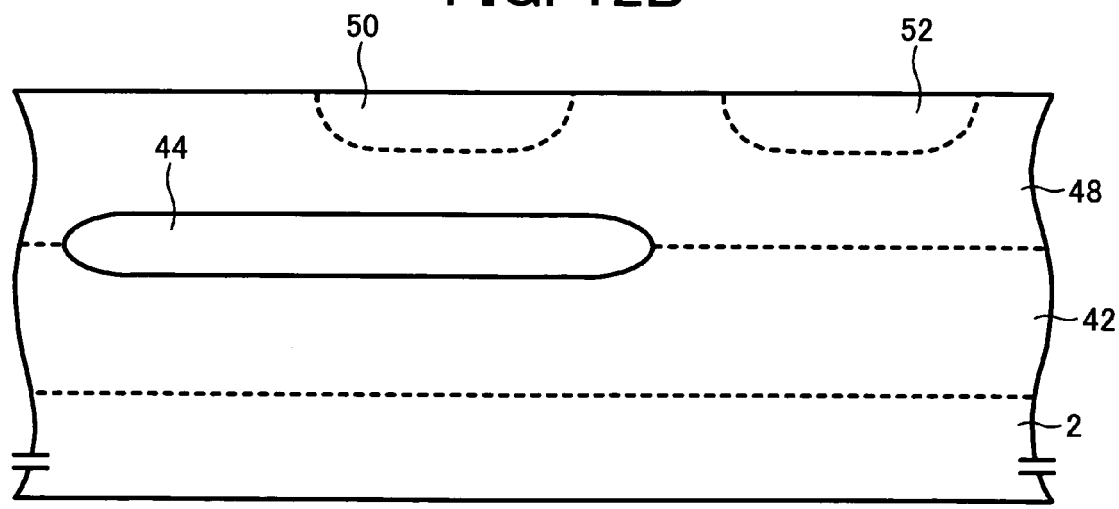
Figure 12C:
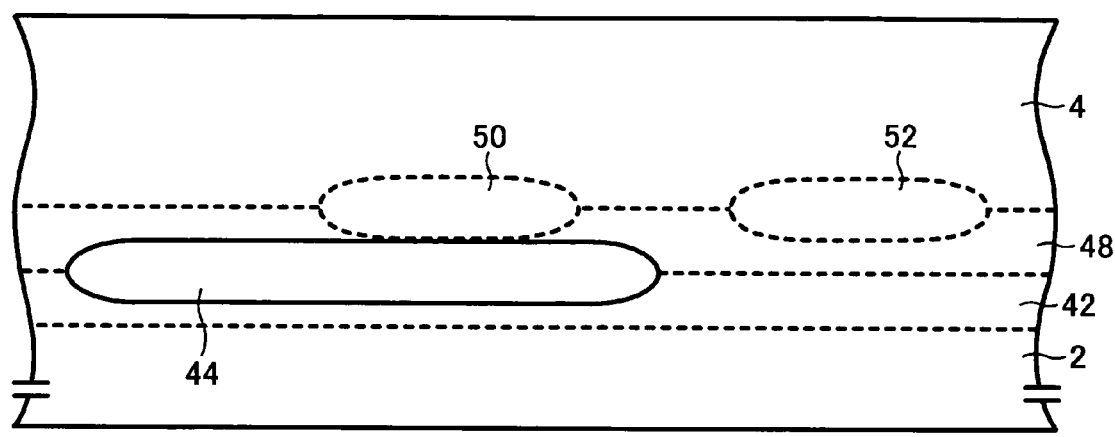
Figure 12D:
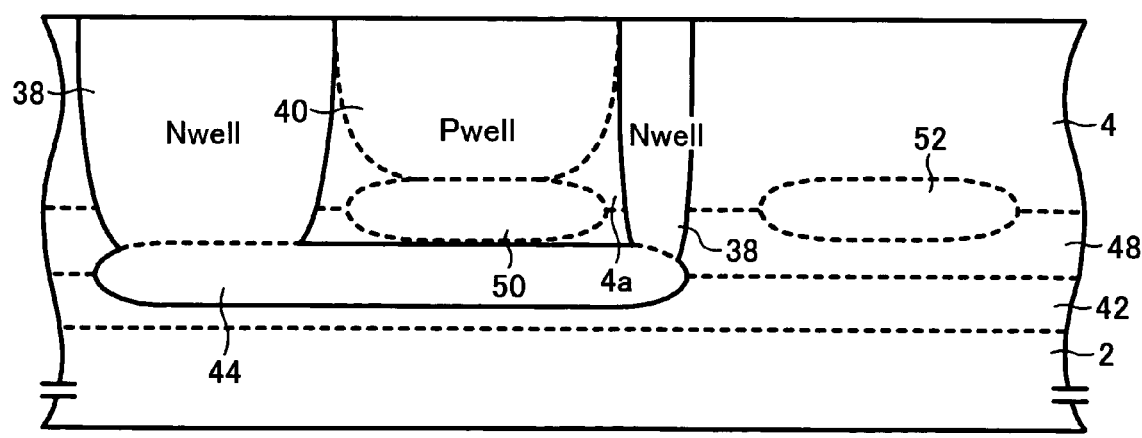

For example, thermal processing is performed at a temperature of 1000° C. for approximately 60 hours, and then the implanted P-type impurity is activated to form the P-type buried layers 50 and 52 (see FIG. 12B).

In Step 2, the P-type low concentration epitaxial layer 4, e.g., having a resistivity of approximately 20 Ωcm and a thickness of 15 μm, is disposed on the P-type low concentration epitaxial layer 48. At this time, the impurities in the P-type buried layers 50 and 52 also diffuse into the P-type low concentration epitaxial layer 4 (see FIG. 12C).

In Step 3, in a similar manner to the above-mentioned Steps 3 and 4 described with reference to FIGS. 7C and 7D, the Nwell regions 38 is formed into the P-type low concentration epitaxial layer 4. A Pwell region 40 is formed in the P-type low concentration epitaxial layer 4a surrounded by the N-type buried layer 44 and the Nwell regions 38 (see FIG. 12D). A bottom of the Pwell region 40 is electrically connected to the P-type buried layer 50. In this case, the Pwell region 40 is not necessarily electrically connected to P-type buried layer 50.

Figure 12E:
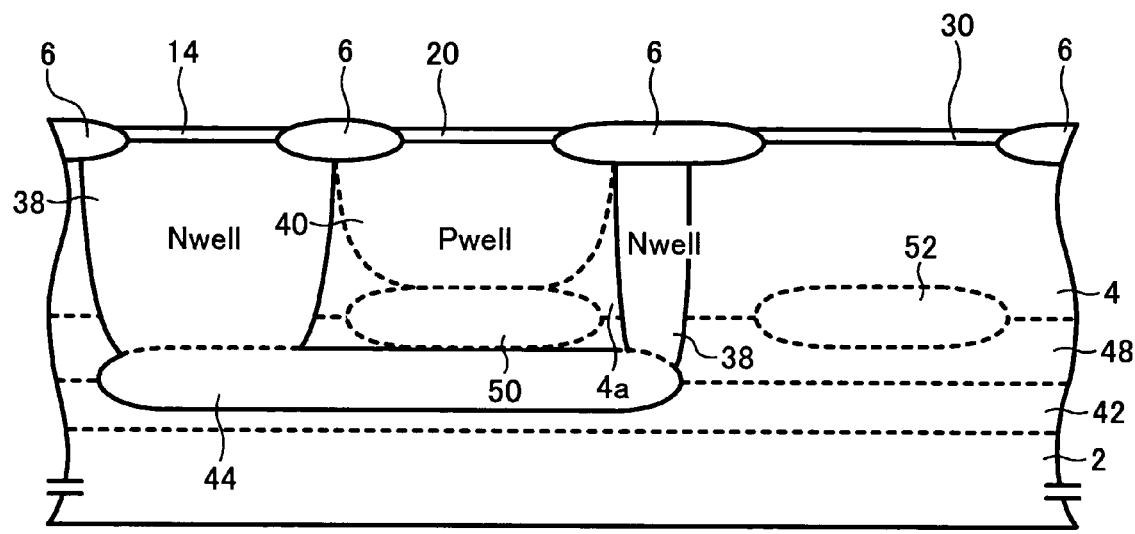
FIGS. 12E–12H are cross-sectional views illustrating an example of a second half of manufacturing processes of the embodiment shown in FIG. 11.
Figure 12F:
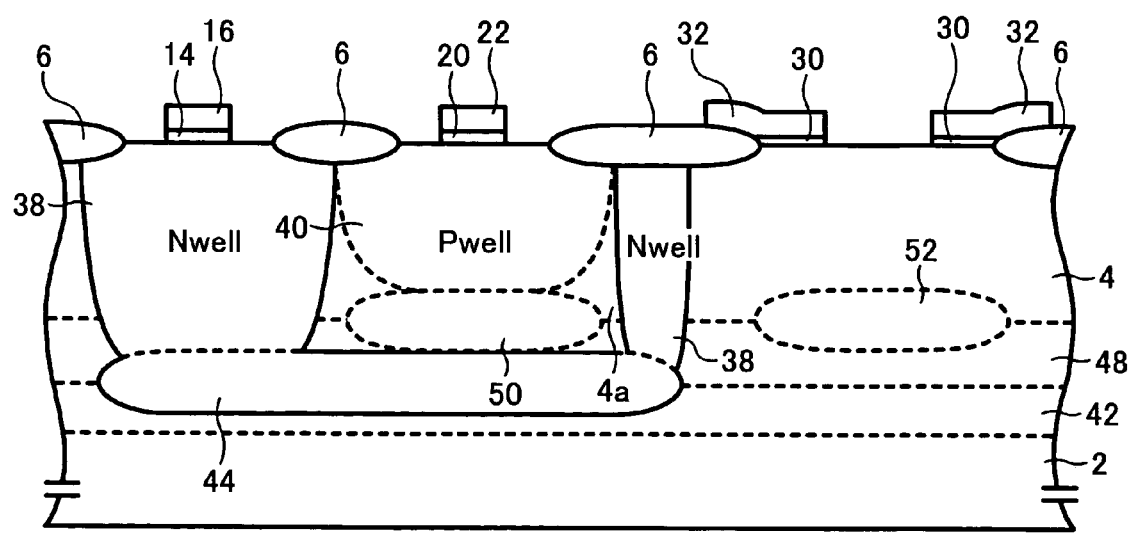
Figure 12G:
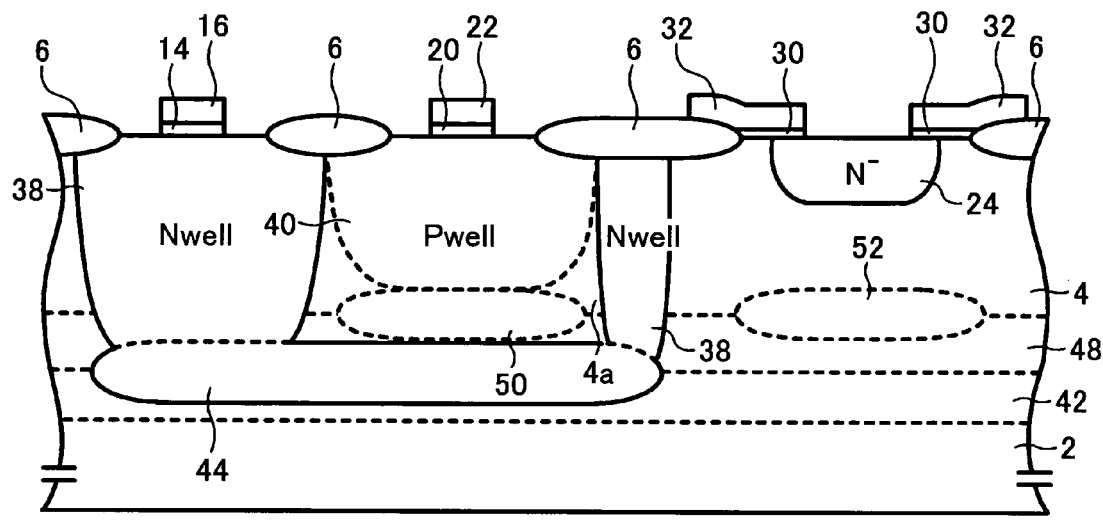
Figure 12H:
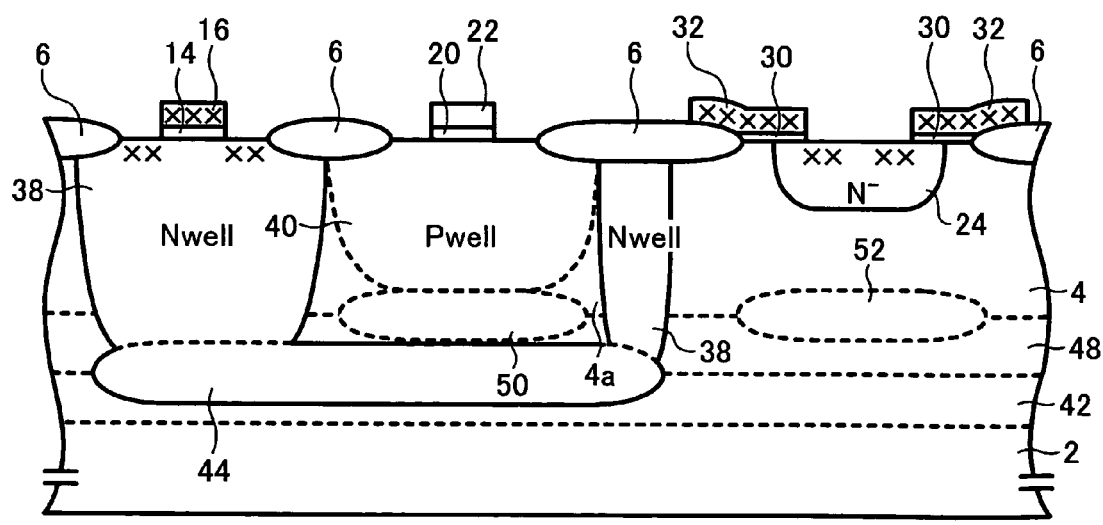

In Step 4, in a similar manner to the above-mentioned Steps 5 to 9 described with reference to FIGS. 4E–4H and FIG. 3, the LOCOS oxide layers 6 and the gate oxide layers 14, 20, and 30 are formed (see FIG. 12E). After a channel doping implant to the PchMOS transistor and the NchMOS transistor, gate electrodes 16, 22, 32 are formed (see FIG. 12F), followed by formation of the N-channel diffusion layer 24 (see FIG. 12G). The P-type impurity is selectively implanted into source formation regions in the Nwell regions 38 which is the PchMOS transistor formation region and the N-channel diffusion layer 24 which is the PchDMOS transistor formation region (see FIG. 12H). The N-type impurity is selectively implanted into the Pwell region 40 which is the NchMOS transistor formation region and the N-type high concentration diffusion layer formation region in the N-channel diffusion layer 24 which is the PchDMOS formation region. Thermal processing is then performed to form the P-type high concentration diffusion layers 12 and 26 and the N-type high concentration diffusion layers 18 and 28 (see FIG. 11).

Figure 13:
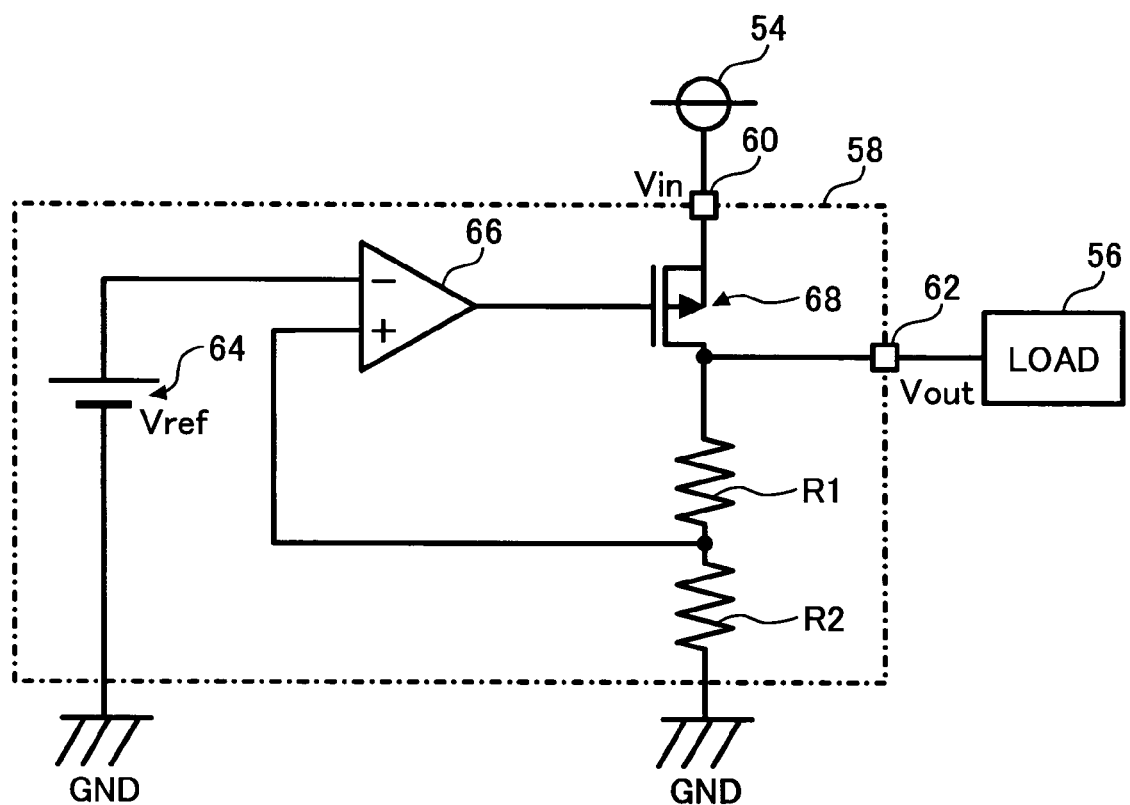
FIG. 13 is circuit diagram illustrating an embodiment of a semiconductor device including a fixed voltage circuit.
Figure 14:
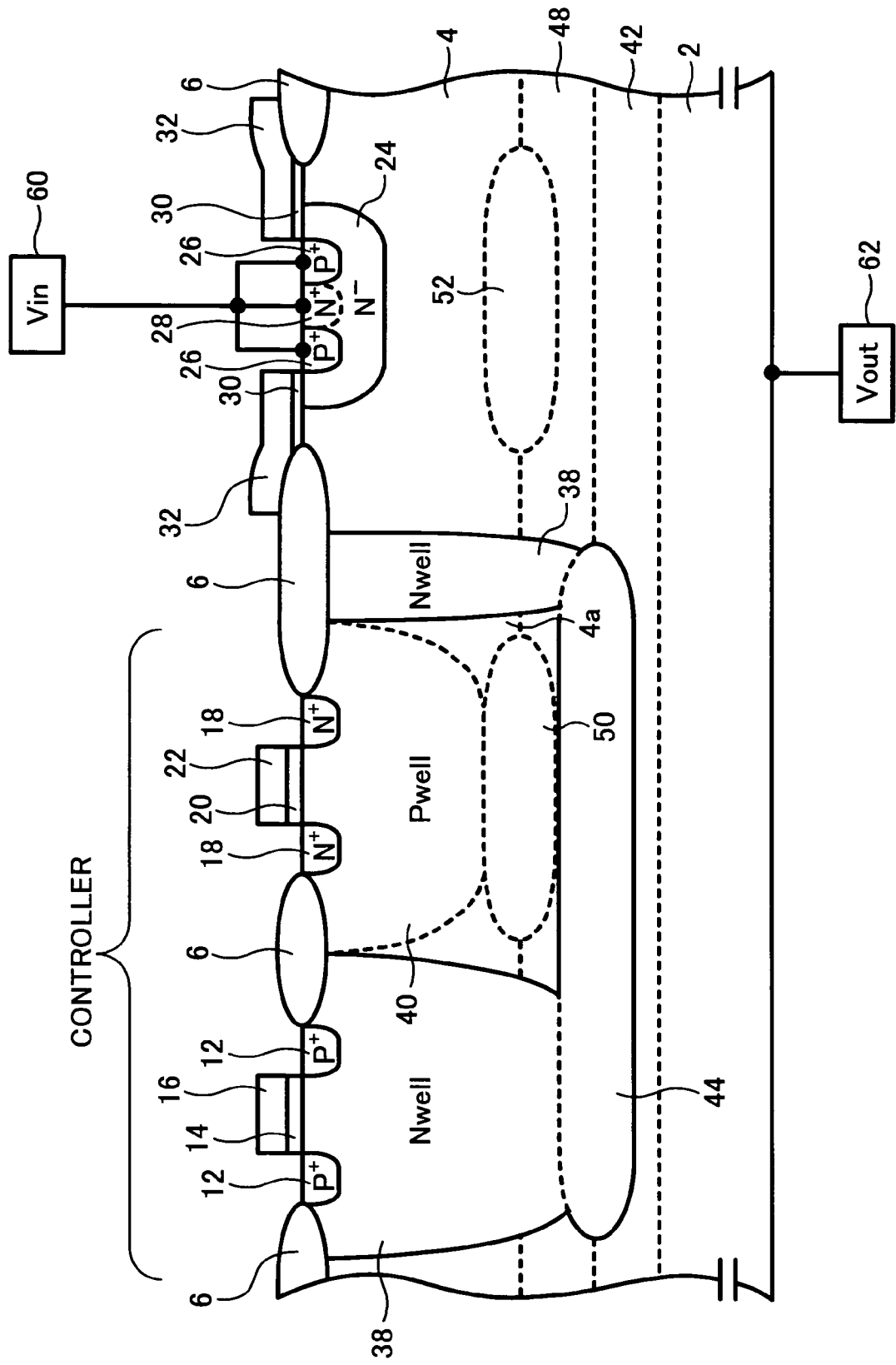
FIG. 14 is a cross-sectional view illustrating a connection when a semiconductor device including a PchDMOS transistor and CMOS transistor is applied to a fixed voltage circuit.

Referring to FIG. 13, a fixed voltage circuit will be described. FIG. 13 is a circuit diagram illustrating an exemplary fixed voltage circuit to which the semiconductor device according to the present invention is applied. FIG. 14 is a cross-sectional view illustrating a connection when the semiconductor device including the PchDMOS transistor and the CMOS transistor is applied to the fixed voltage circuit. The semiconductor device shown in FIG. 14 has a similar structure as the embodiment shown in FIG. 11.

In FIG. 13, a fixed voltage circuit 58 is provided to stably supply voltage from a power source 54 to a load 56. The fixed voltage circuit 58 includes an input terminal (Vin) 60, an output terminal (Vout) 62, a reference voltage generator (Vref) 64, an operational amplifier 66, an output transistor (DRV) 68, and voltage divider resistors R1 and R2. The input terminal (Vin) 60 is connected to the power source 54. The output transistor 68 includes a PchDMOS transistor.

The reference voltage generator 64 and the operational amplifier 66 serve as a controller.

A source of the output transistor 68 is connected to the input terminal 60. A drain of the output transistor 68 is connected to the output terminal 62. In the operational amplifier 66, an output terminal is connected to a gate electrode of the output transistor 68, a reference voltage Vref is applied to an inverting input terminal from the reference voltage generator 64, and an output voltage Vout divided by resistors R1 and R2 is applied to a non-inverting input terminal. As a result, the output voltage Vout, divided by the resistors R1 and R2, is controlled to be equal to the reference voltage.

As shown in FIG. 14, according to the present invention, the input terminal (Vin) 60 is connected to the P-type high concentration diffusion layers 26 and the N-type high concentration diffusion layers 28. The P-type high concentration diffusion layers 26 include sources of the PchDMOS transistor. The N-type high concentration diffusion layers 28 serves to assume a potential of the N-channel diffusion layer 24. The output terminal (Vout) 62 is connected to the P-type high concentration semiconductor substrate 2 including a drain.

The CMOS transistor as shown in FIG. 14 is applied to the CMOS transistor for use in the reference voltage generator 64 and the operational amplifier 66 including the controller in FIG. 13.

As shown in FIG. 14, in the semiconductor device according to the present invention, the output transistor is implemented by a vertical DMOS transistor so that the semiconductor substrate functions as the output terminal 62. The thus-structured output transistor has only a source wire, not both source and drain wires, on the main surface side, thereby reducing a size of the output transistor. Further, since a current flows from the P-type high concentration diffusion layers 26 on the main surface to the P-type high concentration semiconductor substrate 2, a current-carrying cross-sectional area can be larger and current handling capability can be higher. In addition, the output terminal 62 is used as a substrate, resulting in a higher heat dissipation characteristics. Moreover, only MOS transistor can form a fixed voltage circuit, thereby reducing current consumption.

The above-mentioned embodiment describes the arrangement using a P-type semiconductor substrate. However, the present invention is not limited to the foregoing, and a similar effect can also be attained by using an N-type semiconductor substrate to form a conductivity type opposite to that of the embodiment.

The semiconductor device according to present invention includes an output transistor and a fixed voltage circuit. The fixed voltage circuit includes a controller configured to compare an output voltage from the output transistor with a reference voltage and provide feedback such that the output voltage remains constant. In the fixed voltage circuit, the output transistor includes a DMOS transistor and a CMOS transistor. The DMOS transistor is included in the semiconductor device according to present invention. The CMOS transistor is included in the CMOS semiconductor device used by the controller according to present invention.

In the present embodiment, although a vertical DMOS transistor relies upon a vertical planar DMOS transistor which includes a gate electrode through a gate oxide layer on a surface of the substrate and forms source and channel diffusion layers by a double diffusion layer, the present invention is not limited to the foregoing. Other vertical DMOS transistor, such as a vertical trench DMOS transistor having a gate electrode buried in a substrate, can be also used.

Numerous additional modifications and variations are possible in light of the above teachings. It is therefore to be understood that within the scope of the appended claims, the disclosure of this patent specification may be practiced otherwise than as specifically described herein.

What is claimed as new and desired to be protected by Letters Patent of the United States is:

1. A semiconductor device, comprising:
   a P-type semiconductor substrate;
   a P-channel DMOS transistor disposed on the P-type semiconductor substrate and including a drain formed of the P-type semiconductor substrate and a source formed in the P-type semiconductor substrate on a main surface of the P-type semiconductor substrate; and
   a CMOS transistor disposed on the P-type semiconductor substrate and including a P-channel MOS transistor formed in an N-type region formed in the P-type semiconductor substrate on the main surface of the P-type semiconductor substrate and an N-channel MOS transistor formed in a P-type region formed in the P-type semiconductor substrate on the main surface of the P-type semiconductor substrate, the P-type region being electrically isolated from the P-type semiconductor substrate by the N-type region.

2. The semiconductor device as defined in claim 1, wherein the P-type semiconductor substrate comprises a P-type high concentration semiconductor substrate and a first P-type low concentration epitaxial layer, the P-type high concentration semiconductor substrate being disposed opposite to the main surface of the P-type semiconductor substrate, and the first P-type low concentration epitaxial layer being disposed over the P-type high concentration semiconductor substrate.

3. The semiconductor device as defined in claim 2, wherein the N-type region comprises a bottom portion including an N-type buried layer which is disposed at an interface of the P-type high concentration semiconductor substrate and the first P-type low concentration epitaxial layer.

4. The semiconductor device as defined in claim 3, wherein the N-type region further comprises at least two side portions, each including an Nwell region, to form a structure such that the P-type region is surrounded by the Nwell regions and the N-type buried layer.

5. The semiconductor device as defined in claim 2, wherein the first P-type low concentration epitaxial layer includes a P-type buried layer disposed under a region where the source of the P-channel DMOS transistor is formed.

6. A semiconductor device, comprising: a P-type semiconductor substrate including a P-type high concentration semiconductor substrate, a first P-type low concentration epitaxial layer, and a second P-type low concentration epitaxial layer, the P-type high concentration semiconductor substrate being disposed opposite to the main surface of the P-type semiconductor substrate, the second P-type low concentration epitaxial layer being disposed over the P-type high concentration semiconductor substrate, and the first P-type low concentration epitaxial layer being disposed over the second P-type low concentration epitaxial layer; a P-channel DMOS transistor disposed on the P-type semiconductor substrate and including a drain formed of the P-type semiconductor substrate and a source formed in the P-type semiconductor substrate on the main surface of the P-type semiconductor substrate; and a CMOS transistor disposed on the P-type semiconductor substrate and including a P-channel MOS transistor formed in an N-type region formed in the P-type semiconductor substrate on the main surface of the P-type semiconductor substrate and an N-channel MOS transistor formed in a P-type region formed in the P-type semiconductor substrate on the main surface of the P-type semiconductor substrate, the P-type region being electrically isolated from the P-type semiconductor substrate by the N-type region, wherein the N-type region comprises a bottom portion including an N-type buried layer which is disposed at an interface of the first P-type low concentration epitaxial layer and the second P-type low concentration epitaxial layer.

7. A semiconductor device, comprising: a P-type semiconductor substrate including a P-type high concentration semiconductor substrate, a first P-type low concentration epitaxial layer, a second P-type low concentration epitaxial layer, and a third P-type low concentration epitaxial layer, the P-type high concentration semiconductor substrate being disposed opposite to the main surface of the P-type semiconductor substrate, the second P-type low concentration epitaxial layer being disposed over the P-type high concentration semiconductor substrate, the third P-type low concentration epitaxial layer being disposed over the second P-type low concentration epitaxial layer, and the first P-type low concentration epitaxial layer being disposed over the third P-type low concentration epitaxial layer; a P-channel DMOS transistor disposed on the P-type semiconductor substrate and including a drain formed of the P-type semiconductor substrate and a source formed in the P-type semiconductor substrate on the main surface of the P-type semiconductor substrate; and a CMOS transistor disposed on the P-type semiconductor substrate and including a P-channel MOS transistor formed in an N-type region formed in the P-type semiconductor substrate on a main surface of the P-type semiconductor substrate and an N-channel MOS transistor formed in a P-type region formed in the P-type semiconductor substrate on the main surface of the P-type semiconductor substrate, the P-type region being electrically isolated from the P-type semiconductor substrate by the N-type region, wherein the N-type region comprises a bottom portion including an N-type buried layer which is disposed at an interface of the second P-type low concentration epitaxial layer and the third P-type low concentration epitaxial layer, and the P-type region comprises a bottom portion including a P-type buried layer which is disposed at an interface of the first P-type low concentration epitaxial layer and the third P-type low concentration epitaxial layer.

8. A semiconductor device, comprising:
an N-type semiconductor substrate comprising a first N-type low concentration region over an N-type high concentration substrate region;
an N-channel DMOS transistor disposed on the N-type semiconductor substrate and including a drain formed of the N-type semiconductor substrate and a source formed in the N-type semiconductor substrate on a main surface of the N-type semiconductor substrate; and
a CMOS transistor disposed on the N-type semiconductor substrate and including an N-channel MOS transistor formed in a P-type region formed in the N-type semiconductor substrate on the main surface of the N-type semiconductor substrate and a P-channel MOS transistor formed in an N-type region formed in the N-type semiconductor substrate on the main surface of the N-type semiconductor substrate, the N-type region being electrically isolated from the N-type semiconductor substrate by the P-type region.

9. The semiconductor device as defined in claim 8, wherein the first N-type low concentration region is an epitaxial layer being disposed over the N-type high concentration semiconductor substrate region.

10. The semiconductor device as defined in claim 9, wherein the P-type region comprises a bottom portion including a P-type buried layer which is disposed at an interface of the N-type high concentration semiconductor substrate and the first N-type low concentration epitaxial layer.

11. The semiconductor device as defined in claim 10, wherein the P-type region further comprises at least two side portions, each including an Pwell region, to form a structure such that the N-type region is surrounded by the Pwell regions and the P-type buried layer.

12. The semiconductor device as defined in claim 9, wherein the first N-type low concentration epitaxial layer includes an N-type buried layer disposed under a region where the source of the N-channel DMOS transistor is formed.

13. A semiconductor device, comprising:
an N-type semiconductor substrate including an N-type high concentration semiconductor substrate, a first N-type low concentration epitaxial layer, and a second N-type low concentration epitaxial layer, the N-type high concentration semiconductor substrate being disposed opposite to a main surface of the N-type semiconductor substrate, the second N-type low concentration epitaxial layer being disposed over the N-type high concentration semiconductor substrate, and the first N-type low concentration epitaxial layer being disposed over the second N-type low concentration epitaxial layer;
an N-channel DMOS transistor disposed on the N-type semiconductor substrate and including a drain formed of the N-type semiconductor substrate and a source formed in the N-type semiconductor substrate on the main surface of the N-type semiconductor substrate; and
a CMOS transistor disposed on the N-type semiconductor substrate and including an N-channel MOS transistor formed in a P-type region formed in the N-type semiconductor substrate on the main surface of the N-type semiconductor substrate and a P-channel MOS transistor formed in an N-type region formed in the N-type semiconductor substrate on the main surface of the N-type semiconductor substrate, the N-type region being electrically isolated from the N type semiconductor substrate by the P-type region, wherein the P-type region comprises a bottom portion including a P-type buried layer which is disposed at an interface of the first N-type low concentration epitaxial layer and the second N-type low concentration epitaxial layer.

14. A semiconductor device, comprising:
an N-type semiconductor substrate including an N-type high concentration semiconductor substrate, a first N-type low concentration epitaxial layer, a second N-type low concentration epitaxial layer, and a third N-type low concentration epitaxial layer, the N-type high concentration semiconductor substrate being disposed opposite to a main surface of the N-type semiconductor substrate, the second N-type low concentration epitaxial layer being disposed over the N-type high concentration semiconductor substrate, the third N-type low concentration epitaxial layer being disposed over the second N-type low concentration epitaxial layer, and the first N-type low concentration epitaxial layer being disposed over the third N-type low concentration epitaxial layer;
an N-channel DMOS transistor disposed on the N-type semiconductor substrate and including a drain formed of the N-type semiconductor substrate and a source formed in the N-type semiconductor substrate on the main surface of the N-type semiconductor substrate; and
a CMOS transistor disposed on the N-type semiconductor substrate and including an N-channel MOS transistor formed in a P-type region formed in the N-type semiconductor substrate on the main surface of the N-type semiconductor substrate and a P-channel MOS transistor formed in an N-type region formed in the N-type semiconductor substrate on the main surface of the N-type semiconductor substrate, the N-type region being electrically isolated from the N-type semiconductor substrate by the P-type region, wherein the P-type region comprises a bottom portion including a P-type buried layer which is disposed at an interface of the second N-type low concentration epitaxial layer and the third N-type low concentration epitaxial layer, and the N-type buried layer is disposed on a bottom of the N-type region disposed at an interface of the first N-type low concentration epitaxial layer and the third N-type low concentration epitaxial layer.

15. A semiconductor device comprising:
a fixed voltage circuit comprising: a P-type semiconductor substrate; an output transistor including a P-channel DMOS transistor disposed on the P-type semiconductor substrate and including a drain formed of the P-type semiconductor substrate and a source formed in the P-type semiconductor substrate on a main surface of the P-type semiconductor substrate; and
a controller including a CMOS transistor disposed on the P-type semiconductor substrate and including a P-channel MOS transistor formed in an N-type region formed in the P-type semiconductor substrate on the main surface of the P-type semiconductor substrate and an N-channel MOS transistor formed in a P-type region formed in the P-type semiconductor substrate on the main surface of the P-type semiconductor substrate, the P-type region being electrically isolated from the P-type semiconductor substrate by the N-type region, wherein the controller is configured to compare an output voltage from the output transistor with a reference voltage and provide feedback such that the output voltage remains constant.

16. The semiconductor device as defined in claim 15, wherein the P-type semiconductor substrate comprises a P-type high concentration semiconductor substrate and a first P-type low concentration epitaxial layer, the P-type high concentration semiconductor substrate being disposed opposite to the main surface of the P-type semiconductor substrate, and the first P-type low concentration epitaxial layer being disposed over the P-type high concentration semiconductor substrate.

17. The semiconductor device as defined in claim 16, wherein the N-type region comprises a bottom portion including an N-type buried layer which is disposed at an interface of the P-type high concentration semiconductor substrate and the first P-type low concentration epitaxial layer.

18. The semiconductor device as defined in claim 17, wherein the N-type region further comprises at least two side portions, each including an Nwell region, to form a structure such that the P-type region is surrounded by the Nwell regions and the N-type buried layer.

19. The semiconductor device as defined in claim 16, wherein the first P-type low concentration epitaxial layer includes a P-type buried layer disposed under a region where the source of the P-channel DMOS transistor is formed.

20. A semiconductor device, comprising:
a fixed voltage circuit, comprising: a P-type semiconductor substrate including a P-type high concentration semiconductor substrate, a first P-type low concentration epitaxial layer, and a second P-type low concentration epitaxial layer, the P-type high concentration semiconductor substrate being disposed opposite to a main surface of the P-type semiconductor substrate, the second P-type low concentration epitaxial layer being disposed over the P-type high concentration semiconductor substrate, and the first P-type low concentration epitaxial layer being disposed over the second P-type low concentration epitaxial layer;
an output transistor including a P-channel DMOS transistor disposed on the P-type semiconductor substrate and including a drain formed of the P-type semiconductor substrate and a source formed in the P-type semiconductor substrate on the main surface of the P-type semiconductor substrate, and
a controller including a CMOS transistor disposed on the P-type semiconductor substrate and including a P-channel MOS transistor formed in an N-type region formed in the P-type semiconductor substrate on the main surface of the P-type semiconductor substrate and an N-channel MOS transistor formed in a P-type region formed in the P-type semiconductor substrate on the main surface of the P-type semiconductor substrate, the P-type region being electrically isolated from the P-type semiconductor substrate by the N-type region, wherein the N-type region comprises a bottom portion including an N-type buried layer which is disposed at an interface of the first P-type low concentration epitaxial layer and the second P-type low concentration epitaxial layer.

21. A semiconductor device, comprising:
a fixed voltage circuit, comprising: a P-type semiconductor substrate including a P-type high concentration semiconductor substrate, a first P-type low concentration epitaxial layer, a second P-type low concentration epitaxial layer, and a third P-type low concentration epitaxial layer, the P-type high concentration semiconductor substrate being disposed opposite to a main surface of the P-type semiconductor substrate, the second P-type low concentration epitaxial layer being disposed over the P-type high concentration semiconductor substrate, the third P-type low concentration epitaxial layer being disposed over the second P-type low concentration epitaxial layer, and the first P-type low concentration epitaxial layer being disposed over the third P-type low concentration epitaxial layer;

an output transistor including a P-channel DMOS transistor disposed on the P-type semiconductor substrate and including a drain formed of the P-type semiconductor substrate and a source formed in the P-type semiconductor substrate on the main surface of the P-type semiconductor substrate; and a controller including a CMOS transistor disposed on the P-type semiconductor substrate and including a P-channel MOS transistor formed in an N-type region formed in the P-type semiconductor substrate on the main surface of the P-type semiconductor substrate and an N-channel MOS transistor formed in a P-type region formed in the P-type semiconductor substrate on the main surface of the P-type semiconductor substrate, the P-type region being electrically isolated from the P-type semiconductor substrate by the N-type region, wherein the N-type region comprises a bottom portion including an N-type buried layer which is disposed at an interface of the second P-type low concentration epitaxial layer and the third P-type low concentration epitaxial layer, and the P-type buried layer is disposed on a bottom of the P-type region disposed at an interface of the first P-type low concentration epitaxial layer and the third P-type low concentration epitaxial layer.

22. A semiconductor device, comprising:

a first-polarity-type semiconductor substrate;

a first-polarity-channel DMOS transistor disposed on the first-polarity-type semiconductor substrate and including a drain formed of the first-polarity-type semiconductor substrate and a source formed in the first-polarity-type semiconductor substrate on a main surface of the first-polarity-type semiconductor substrate; and a CMOS transistor disposed on the first-polarity-type semiconductor substrate and including a first-polarity-channel MOS transistor formed in a second-polarity-type region formed in the first-polarity-type semiconductor substrate on the main surface of the first-polarity-type semiconductor substrate and a second-polarity-channel MOS transistor formed in a first-polarity-type region formed in the first-polarity-type semiconductor substrate on the main surface of the first-polarity-type semiconductor substrate, the first-polarity-type region being electrically isolated from the first-polarity-type semiconductor substrate by the second-polarity-type region.

* * * * *